United States Patent
Sakata

(10) Patent No.: US 8,367,486 B2
(45) Date of Patent: Feb. 5, 2013

(54) TRANSISTOR AND METHOD FOR MANUFACTURING THE TRANSISTOR

(75) Inventor: Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 423 days.

(21) Appl. No.: 12/690,453

(22) Filed: Jan. 20, 2010

(65) Prior Publication Data

US 2010/0193782 A1   Aug. 5, 2010

(30) Foreign Application Priority Data

Feb. 5, 2009   (JP) ................... 2009-024966

(51) Int. Cl.
*H01L 21/336* (2006.01)
*H01L 29/225* (2006.01)
*H01L 21/84* (2006.01)
*H01L 29/786* (2006.01)

(52) U.S. Cl. ........ 438/151; 438/486; 438/608; 438/158; 438/166; 438/479; 257/E21.316; 257/E21.134

(58) Field of Classification Search .............. 438/142, 438/197, 285, 478, 482, 486, 487, 608, 758, 438/761, 763, FOR. 385; 257/E21.297, E21.316, 257/E21.412, E21.113, E21.134
See application file for complete search history.

(56) References Cited

U.S. PATENT DOCUMENTS

| | | | |
|---|---|---|---|
| 5,744,864 A | 4/1998 | Cillessen et al. | |
| 6,533,965 B1 * | 3/2003 | Sasaki et al. | 252/519.5 |
| 6,727,522 B1 | 4/2004 | Kawasaki et al. | |
| 7,061,014 B2 | 6/2006 | Hosono et al. | |
| 7,064,346 B2 | 6/2006 | Kawasaki et al. | |
| 7,420,215 B2 * | 9/2008 | Inoue et al. | 257/72 |
| 7,732,819 B2 * | 6/2010 | Akimoto et al. | 257/72 |
| 7,825,021 B2 * | 11/2010 | Yamazaki et al. | 438/608 |

(Continued)

FOREIGN PATENT DOCUMENTS

JP   60-170972   9/1985
JP   60-198861   10/1985

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Olik Chaudhuri
*Assistant Examiner* — Quovaunda V Jefferson
(74) *Attorney, Agent, or Firm* — Eric J. Robinson; Robinson Intellectual Property Law Office, P.C.

(57) ABSTRACT

It is an object to reduce characteristic variation among transistors and reduce contact resistance between an oxide semiconductor layer and a source electrode layer and a drain electrode layer, in a transistor where the oxide semiconductor layer is used as a channel layer. In a transistor where an oxide semiconductor is used as a channel layer, at least an amorphous structure is included in a region of an oxide semiconductor layer between a source electrode layer and a drain electrode layer, where a channel is to be formed, and a crystal structure is included in a region of the oxide semiconductor layer which is electrically connected to an external portion such as the source electrode layer and the drain electrode layer.

18 Claims, 22 Drawing Sheets

U.S. PATENT DOCUMENTS

| | | | |
|---|---|---|---|
| 8,058,800 B2 * | 11/2011 | Hwang et al. | 313/506 |
| 2005/0199959 A1 | 9/2005 | Chiang et al. | |
| 2007/0072439 A1 | 3/2007 | Akimoto et al. | |
| 2007/0108446 A1 | 5/2007 | Akimoto | |
| 2010/0176383 A1 * | 7/2010 | Park et al. | 257/40 |
| 2012/0052624 A1 * | 3/2012 | Yamazaki | 438/104 |

FOREIGN PATENT DOCUMENTS

| | | |
|---|---|---|
| JP | 08-264794 | 10/1996 |
| JP | 11-505377 | 5/1999 |
| JP | 2000-150900 | 5/2000 |
| JP | 2004-103957 | 4/2004 |

OTHER PUBLICATIONS

Nakamura et al., "The Phase Relations in the $In_2O_3$-$Ga_2ZnO_4$-Zno System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ =3, 4, and 5), $InGaO_3(ZnO)_3$, and $Ga_2O_3(ZnO)m$ ($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)m$ ) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Masuda et al., "Transparent thin film transistors using ZnO as an active channel layer and their electrical properties," Journal of Applied Physics, Feb. 1, 2003, vol. 93, No. 3, pp. 1624-1630.

* cited by examiner

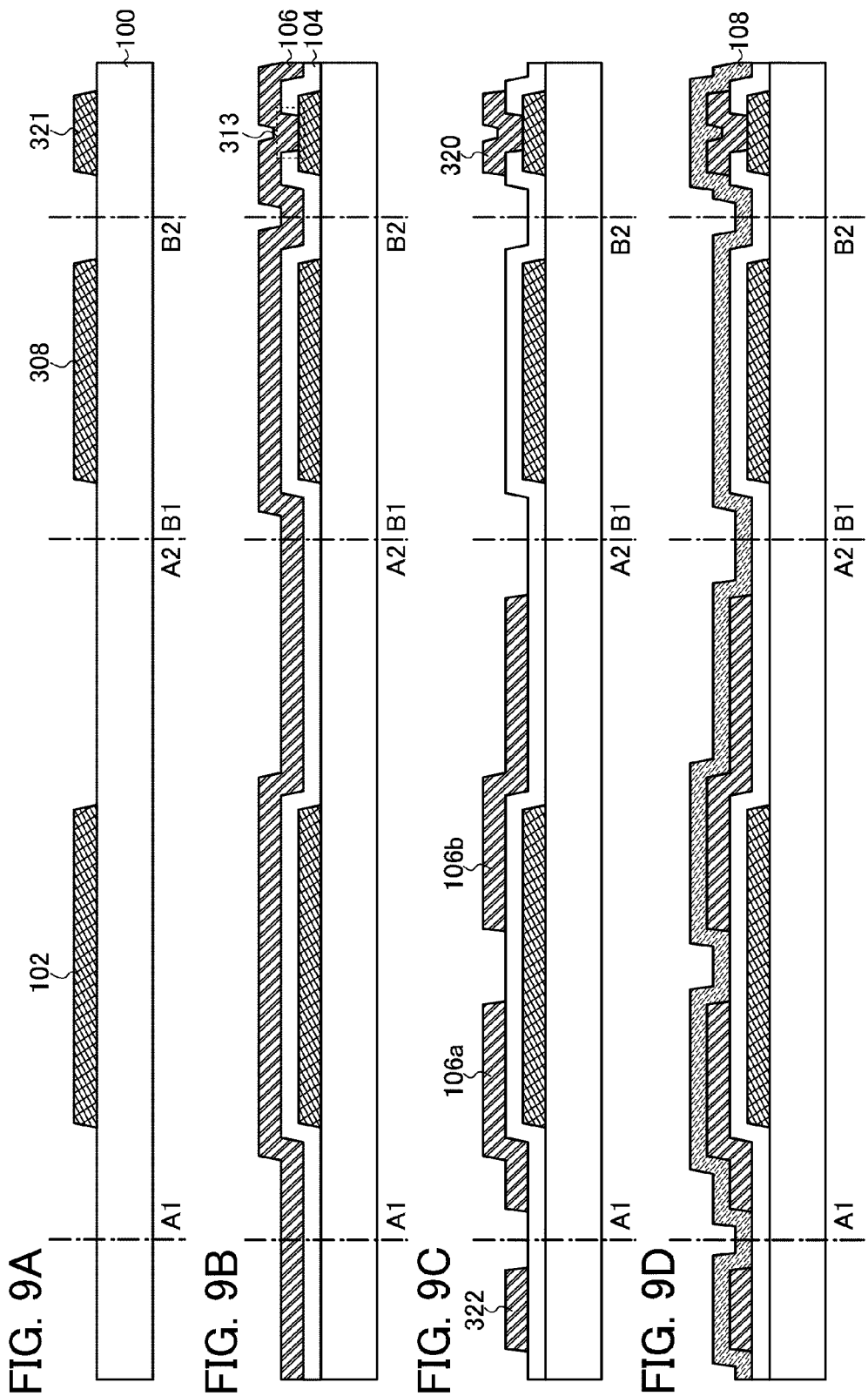

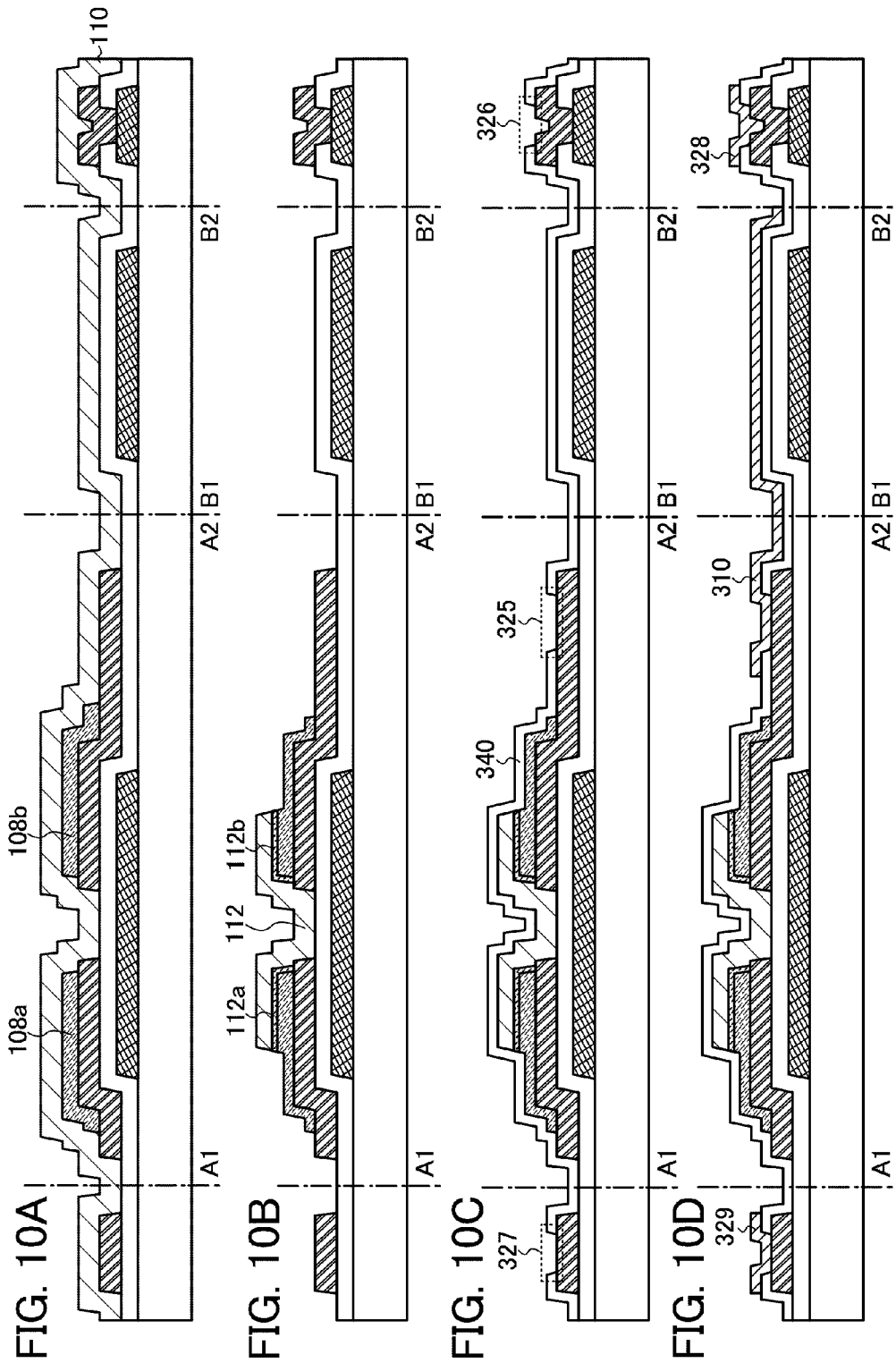

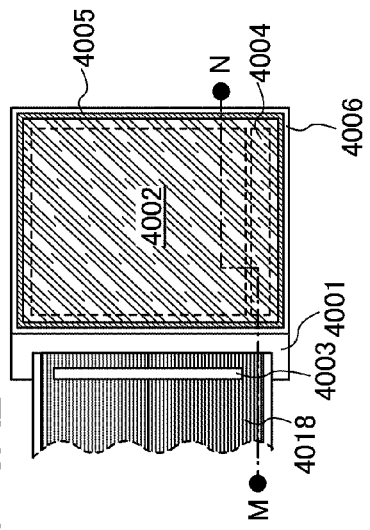
FIG. 16A1
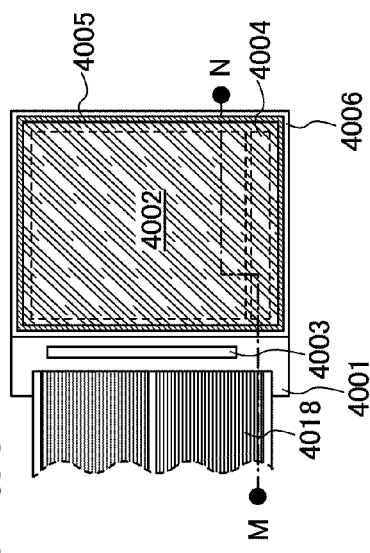
FIG. 16A2
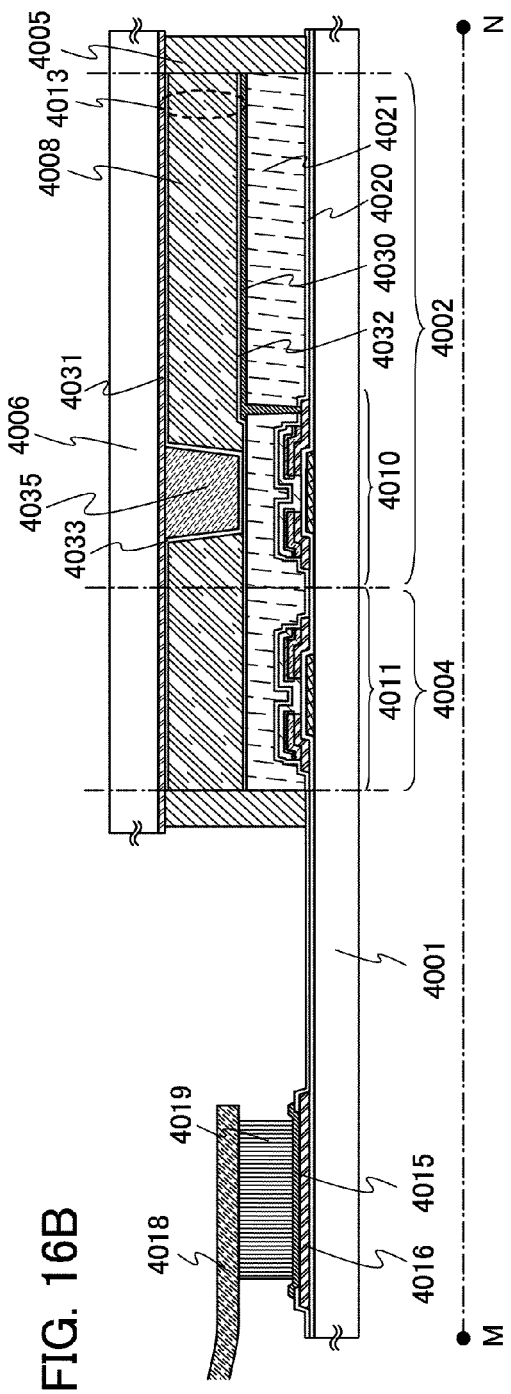
FIG. 16B

| element | diffusion coefficient D (cm$^2$/sec) |
|---|---|
| In | $9.22 \times 10^{-7}$ |
| Ga | $8.18 \times 10^{-7}$ |
| Zn | $1.69 \times 10^{-6}$ |
| O | $1.29 \times 10^{-6}$ | ns to a transistor using an oxide semiconductor layer, a semiconductor device provided with the transistor, and a method for manufacturing the same.

TRANSISTOR AND METHOD FOR MANUFACTURING THE TRANSISTOR

BACKGROUND OF THE INVENTION

1. Field of the Invention

The present invention relates to a transistor using an oxide semiconductor layer, a semiconductor device provided with the transistor, and a method for manufacturing the same.

2. Description of the Related Art

Various metal oxides exist and are used for a variety of applications. Indium oxide is a well-known material and is used as a transparent electrode material which is necessary for liquid crystal displays and the like.

Some metal oxides exhibit semiconductor characteristics. As metal oxides exhibiting semiconductor characteristics, tungsten oxide, tin oxide, indium oxide, zinc oxide, and the like are given. A thin film transistor in which such metal oxide exhibiting semiconductor characteristics is used for a channel formation region is disclosed (Patent Documents 1 to 4 and Non-Patent Document 1).

As metal oxides, multi-component oxides are known as well as single-component oxides. For example, $InGaO_3(ZnO)_m$ (m: natural number) having homologous phase is a known material (Non-Patent Documents 2 to 4).

In addition, it has been confirmed that such In—Ga—Zn-based oxide can be used for a channel layer of a thin film transistor (also referred to as a TFT) (Patent Document 5, and Non-Patent Documents 5 and 6).

Further, an In—Ga—Zn-based oxide semiconductor having an amorphous structure is formed more easily than zinc oxide (ZnO) having an amorphous structure. Thus, an In—Ga—Zn-based oxide semiconductor is used for a channel layer of a transistor, whereby characteristic variation among transistors can be reduced even when a substrate to be manufactured has a large area and the transistors can be normally off. Meanwhile, in a case where an oxide semiconductor layer including an amorphous structure is used for a channel layer, there is a problem in that contact resistance between the oxide semiconductor layer and a source and a drain electrode layer is increased.

CITATION LIST

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$, (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

In view of the foregoing problems, it is an object of one embodiment of the present invention to reduce characteristic variation among transistors and reduce contact resistance between an oxide semiconductor layer and a source electrode layer and a drain electrode layer, in each of the transistors where the oxide semiconductor layer is used as a channel layer.

SUMMARY OF THE INVENTION

In order to solve the above object, according to one embodiment of the present invention, in a transistor where an oxide semiconductor is used as a channel layer, an amorphous structure is included in at least a region of an oxide semiconductor layer between a source electrode layer and a drain electrode layer, where a channel is to be formed (a channel formation region), and a crystal structure is included in a region of the oxide semiconductor layer which is electrically connected to an external portion such as the source electrode layer and the drain electrode layer.

Further, the oxide semiconductor layer to be a channel layer is electrically connected to the source electrode layer and the drain electrode layer via a metal oxide layer. For example, in a case where the source electrode layer and the drain electrode layer are formed using a metal material, the oxide semiconductor layer to be a channel layer is electrically connected to the source electrode layer and the drain electrode layer via the metal oxide layer. The metal oxide layer can be formed using a material which has higher conductivity than the oxide semiconductor layer to be a channel layer and includes a crystal (single crystal, polycrystal, or microcrystal) structure.

One embodiment of the present invention includes: a gate electrode; a gate insulating layer; a source electrode layer and a drain electrode layer; a first metal oxide layer electrically connected to the source electrode layer; a second metal oxide layer electrically connected to the drain electrode layer; and an oxide semiconductor layer. In the embodiment of the present invention, the oxide semiconductor layer is provided in a region which overlaps with the gate electrode with the gate insulating layer interposed between the oxide semiconductor layer and the gate electrode and is between the source electrode layer and the drain electrode layer, and is also provided in contact with the first metal oxide layer and the second metal oxide layer. Further, in the embodiment of the present invention, in the oxide semiconductor layer, a crystal structure is included in a first region in contact with the first metal oxide layer and in a second region in contact with the second metal oxide layer, and an amorphous structure is included in a region which overlaps with the gate electrode and is between the source electrode layer and the drain electrode layer. Note that, in a case where the first region and the second region are included in the region of the oxide semiconductor layer which overlaps with the gate electrode and is between the source electrode layer and the drain electrode layer, an amorphous structure may be included in a region of the oxide semiconductor layer other than the first region and the second region.

The phrase "a crystal structure is included in a first region and a second region in an oxide semiconductor layer" refers to not only a case where a crystal (single crystal, polycrystal, or microcrystal) structure is entirely included in the first region and the second region, but also a case where an amorphous structure is partly included in the first region and the second region. The phrase "an amorphous structure is included in a region of an oxide semiconductor layer which overlaps with a gate electrode and is between a source electrode layer and a drain electrode layer" refers to not only a case where an amorphous structure is entirely included in the region but also a case where a crystal structure is partly included in the region. Note that even in a case where an amorphous structure is partly included in the first region and the second region and a crystal structure is partly included in the region which overlaps with the gate electrode and is between the source electrode layer and the drain electrode layer, the degree of crystallization (the proportion of a crystal component in the entire volume of a film) in the first region and the second region is made higher than the degree of crystallization in the region which overlaps with the gate electrode and is between the source electrode layer and the drain electrode layer.

Note that the crystal state of the oxide semiconductor layer can be evaluated by observing a cross section of the oxide semiconductor layer with a transmission electron microscope (TEM). That is, by observing with a TEM the first region and the second region of the oxide semiconductor layer and the region of the oxide semiconductor layer which overlaps with the gate electrode and is between the source electrode layer and the drain electrode layer, the degree of crystallization in the first region and the second region and the degree of crystallization in the region which overlaps with the gate electrode and is between the source electrode layer and the drain electrode layer may be compared with each other. The crystal state of the oxide semiconductor layer may be evaluated by X-ray diffraction (XRD) measurement.

One embodiment of the present invention includes: a gate electrode which is provided over a substrate; a gate insulating layer which is provided over the gate electrode; a source electrode layer and a drain electrode layer which are provided over the gate insulating layer; a first metal oxide layer which is provided over the source electrode layer; a second metal oxide layer which is provided over the drain electrode layer; and an oxide semiconductor layer provided over the first metal oxide layer and the second metal oxide layer and provided above the gate electrode and between the source electrode layer and the drain electrode layer. In the embodiment of the present invention, in the oxide semiconductor layer, a crystal structure is included in a first region in contact with the first metal oxide layer and a second region in contact with the second metal oxide layer, and an amorphous structure is included in a region above the gate electrode and between the source electrode layer and the drain electrode layer.

One embodiment of the present invention includes: a gate electrode which is provided over a substrate; a gate insulating layer which is provided over the gate electrode; an oxide semiconductor layer which is provided over the gate insulating layer; a first metal oxide layer and a second metal oxide layer which are provided over the oxide semiconductor layer; a source electrode layer which is provided over the first metal oxide layer; and a drain electrode layer which is provided over the second metal oxide layer. In the embodiment of the present invention, in the oxide semiconductor layer, a crystal structure is included in a first region in contact with the first metal oxide semiconductor layer and a second region in contact with the second metal oxide layer, and an amorphous structure is included in a region above the gate electrode and between the source electrode layer and the drain electrode layer.

One embodiment of the present invention includes: a source electrode layer and a drain electrode layer which are provided over a substrate; a first metal oxide layer which is provided over the source electrode layer; a second metal oxide layer which is provided over the drain electrode layer; an oxide semiconductor layer which is provided between the source electrode layer and the drain electrode layer and over the first metal oxide layer and the second metal oxide layer; a gate insulating layer which is provided over the oxide semiconductor layer; and, over the gate insulating layer, a gate electrode which is provided so as to overlap with the oxide semiconductor layer in a region between the source electrode layer and the drain electrode layer. In the embodiment of the present invention, in the oxide semiconductor layer, a crystal structure is included in a first region in contact with the first metal oxide semiconductor layer and a second region in contact with the second metal oxide layer, and an amorphous structure is included in a region below the gate electrode and between the source electrode layer and the drain electrode layer.

One embodiment of the present invention includes the steps of: forming a gate electrode over a substrate; forming a gate insulating layer over the gate electrode; forming a source electrode layer and a drain electrode layer over the gate insulating layer; forming a first metal oxide layer including zinc and a crystal structure over the source electrode layer; forming a second metal oxide layer including zinc and a crystal structure over the drain electrode layer; forming an oxide semiconductor layer including zinc and an amorphous structure in a region above the gate electrode and between the source electrode layer and the drain electrode layer and over the first metal oxide layer and the second metal oxide layer; and moving zinc from the first metal oxide layer and the second metal oxide layer to the oxide semiconductor layer by performing heat treatment, such that, in the oxide semiconductor layer, a first region in contact with the first metal oxide layer and a second region in contact with the second metal layer are crystallized.

One embodiment of the present invention includes the steps of: forming a gate electrode over a substrate; forming a gate insulating layer over the gate electrode; forming an oxide semiconductor layer including zinc and an amorphous structure over the gate insulating layer; forming a first metal oxide layer and a second metal oxide layer each including zinc and a crystal structure over the oxide semiconductor layer; forming a source electrode layer over the first metal oxide layer; forming a drain electrode layer over the second metal oxide layer; and moving zinc from the first metal oxide layer and the second metal oxide layer to the oxide semiconductor layer by performing heat treatment, such that, in the oxide semiconductor layer, a first region in contact with the first metal oxide layer and a second region in contact with the second metal layer are crystallized.

One embodiment of the present invention includes the steps of: forming a source electrode layer and a drain electrode layer over a substrate; forming a first metal oxide layer including zinc and a crystal structure over the source electrode layer; forming a second metal oxide layer including zinc and a crystal structure over the drain electrode layer; forming an oxide semiconductor layer including zinc and an amorphous structure in a region between the source electrode layer and the drain electrode layer and over the first metal oxide layer and the second metal oxide layer; moving zinc from the first metal oxide layer and the second metal oxide layer to the oxide semiconductor layer by performing heat treatment, such that, in the oxide semiconductor layer, a first region in contact with the first metal oxide layer and a second region in contact with the second metal layer are crystallized; forming a gate insulating layer over the oxide semiconductor layer; and forming a gate electrode so as to overlap with the oxide semiconductor layer provided in a region over the gate insulating layer and between the source electrode layer and the drain electrode layer.

Note that as an example of the oxide semiconductor including an amorphous structure which can be used in this specification, there is an oxide semiconductor represented by $InMO_3(ZnO)_m$ (m>0). Here, denotes one or more metal elements selected from gallium (Ga), iron (Fe), nickel (Ni), manganese (Mn), and cobalt (Co). For example, the case where Ga is selected as M includes the case where the aforementioned metal element other than Ga is selected such as a combination of Ga and Ni, or a combination of Ga and Fe as well as the case where only Ga is used. Moreover, in the oxide semiconductor, in some cases, a transition metal element such as Fe or Ni or an oxide of the transition metal is contained as an impurity element in addition to a metal element contained as M.

In this specification, silicon oxynitride means a substance which contains more oxygen than nitrogen and, in the case where measurements are performed by rutherford backscattering spectrometry (RBS) and hydrogen forward scattering (HFS), preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means a substance that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in silicon oxynitride or silicon nitride oxide is defined as 100 at. %.

In this specification, a semiconductor device means any device which can function by utilizing semiconductor characteristics; a display device, a semiconductor circuit, an electronic device are all included in the category of the semiconductor device. Furthermore, the term "display device" in this specification includes a light-emitting device and a liquid crystal display device in its category. The light-emitting device includes a light-emitting element, and the liquid crystal display device includes a liquid crystal element. A light emitting element includes, in its scope, an element whose luminance is controlled by current or voltage, and specifically includes an inorganic electroluminescent (EL) element, an organic EL element, and the like.

In a transistor where an oxide semiconductor is used for a channel layer, in a region of an oxide semiconductor layer, a channel formation region between a source electrode layer and a drain electrode layer is formed to include an amorphous structure, and a region which is electrically connected to an external portion is formed to include a crystal structure. Thus, characteristic variation among transistors can be reduced and contact resistance between the oxide semiconductor layer and the source electrode layer and the drain electrode layer can be reduced.

BRIEF DESCRIPTION OF THE DRAWINGS

FIGS. 9A to 9D illustrate an example of a method for manufacturing a semiconductor device relating to Embodiment 5.

FIGS. 10A to 10D illustrate the example of the method for manufacturing the semiconductor device relating to Embodiment 5.

FIGS. 16A1, 16A2, and 16B illustrate examples of a semiconductor device relating to Embodiment 6.

DETAILED DESCRIPTION OF THE INVENTION

Figure 1A:
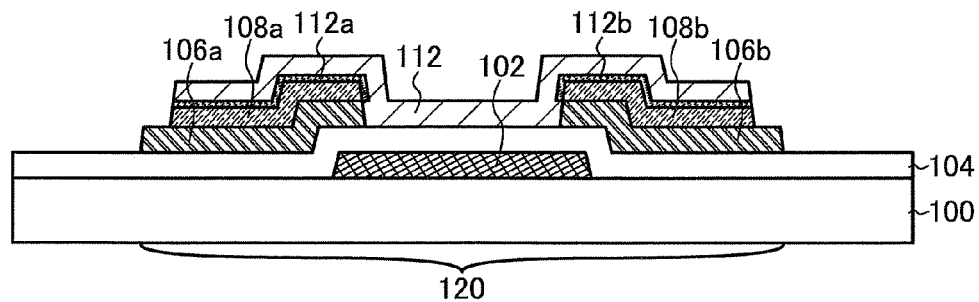
FIGS. 1A to 1C each illustrate a structure of a transistor relating to Embodiment 1.

Embodiments relating to the present invention will be described below with reference to drawings. However, the present invention is not limited to the description of Embodiments given below, and it is apparent to those skilled in the art that various changes and modifications of the modes and details are possible without departing from the purpose of the invention. Therefore, the present invention is not construed as being limited to the description of the following Embodiments. Structures relating to Embodiments can be implemented by being appropriately combined. Note that the same portion or a portion having the same function is denoted by the same reference numeral throughout the structures illustrated below, and the repetitive explanation thereof is omitted.

Embodiment 1

In this embodiment, examples of a structure of a transistor are described with reference to FIGS. 1A to 1C.

A transistor described in this embodiment includes a gate electrode 102, a gate insulating layer 104, a source electrode layer 106a, a drain electrode layer 106b, a first metal oxide layer 108a electrically connected to the source electrode layer 106a, a second metal oxide layer 108b electrically connected to the drain electrode layer 106b, and an oxide semiconductor layer 112 to be a channel layer. The oxide semiconductor layer 112 is provided in a region which overlaps with the gate electrode 102 with the gate insulating layer 104 interposed therebetween and is between the source electrode layer 106a and the drain electrode layer 106b. In addition, the oxide semiconductor layer 112 is provided in contact with the first metal oxide layer 108a and the second metal oxide layer 108b.

In the oxide semiconductor layer 112 to be a channel layer, a crystal structure is included in a first region 112a in contact with the first metal oxide layer 108a and in a second region 112b in contact with the second metal oxide layer 108b, and an amorphous structure is included at least in the region which overlaps with the gate electrode 102 and is between the source electrode layer 106a and the drain electrode layer 106b (in a region where a channel is to be formed). Further, the first metal oxide layer 108a and the second metal oxide layer 108b can be formed using metal oxide including a crystal structure.

Note that the channel layer means a semiconductor layer including a region where a channel is to be formed in a transistor.

The transistor described in this embodiment may be either a top-gate transistor or a bottom-gate transistor as long as the above-described structure is included. In FIGS. 1A to 1C, FIGS. 1A and 1B illustrate a case where a bottom-gate transistor is formed, and FIG. 1C illustrates a case where a top-gate transistor is formed. Hereinafter, specific structures of transistors illustrated in FIGS. 1A to 1C are described.

The transistor 120 illustrated in FIG. 1A includes: the gate electrode 102 which is provided over a substrate 100; the gate insulating layer 104 which is provided over the gate electrode 102; the source electrode layer 106a and the drain electrode layer 106b which are provided over the gate insulating layer 104; the first metal oxide layer 108a which is provided over the source electrode layer 106a; the second metal oxide layer 108b which is provided over the drain electrode layer 106b; and the oxide semiconductor layer 112 which is provided over the first metal oxide layer 108a and the second metal oxide layer 108b and is also provided in a region above the gate electrode 102 and between the source electrode layer 106a and the drain electrode layer 106b.

Figure 1B:
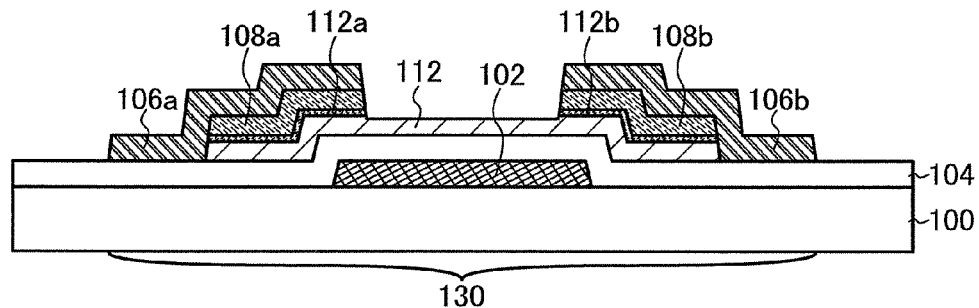

The transistor 130 illustrated in FIG. 1B includes: the gate electrode 102 which is provided over the substrate 100; the gate insulating layer 104 which is provided over the gate electrode 102; the oxide semiconductor layer 112 which is provided over the gate insulating layer 104; the first metal oxide layer 108a and the second metal oxide layer 108b which are separated from each other over the oxide semiconductor layer 112; the source electrode layer 106a which is provided over the first metal oxide layer 108a; and the drain electrode layer 106b which is provided over the second metal oxide layer 108b.

Figure 1C:
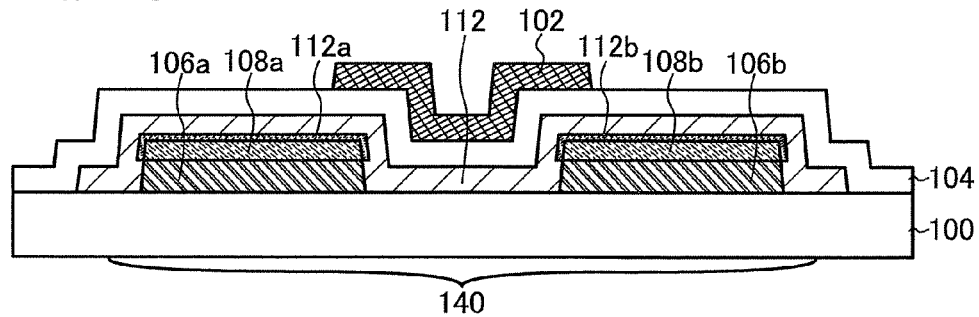

The transistor 140 illustrated in FIG. 1C includes: the source electrode layer 106a and the drain electrode layer 106b which are provided over the substrate 100; the first metal oxide layer 108a which is provided over the source electrode layer 106a; the second metal oxide layer 108b which is provided over the drain electrode layer 106b; the oxide semiconductor layer 112 which is provided over the first metal oxide layer 108a and the second metal oxide layer 108b and between the source electrode layer 106a and the drain electrode layer 106b; the gate insulating layer 104 which is provided over the oxide semiconductor layer 112; and the gate electrode 102 which is provided so as to overlap with the oxide semiconductor layer 112 and between the source electrode layer 106a and the drain electrode layer 106b in a region over the gate insulating layer 104.

Note that in FIGS. 1A to 1C, in the oxide semiconductor layer 112 to be a channel layer, a crystal structure is included in the first region 112a in contact with the first metal oxide layer 108a and in the second region 112b in contact with the second metal oxide layer 108b, and an amorphous structure is included in the region which overlaps with the gate electrode 102 and is between the source electrode layer 106a and the drain electrode layer 106b (in a region where a channel is to be formed). Further, the first metal oxide layer 108a and the second metal oxide layer 108b can be formed using a metal oxide layer including a crystal structure.

In the oxide semiconductor layer 112, an amorphous structure may be included in at least the region which overlaps with the gate electrode 102 and is between the source electrode layer 106a and the drain electrode layer 106b (the region where a channel is to be formed). An amorphous structure may be entirely included in a region of the oxide semiconductor layer 112 other than the first region 112a and the second region 112b. Note that, in the case where, in the oxide semiconductor layer 112, the first region 112a and the second region 112b are included in the region which overlaps with the gate electrode 102 and is between the source electrode layer 106a and the drain electrode layer 106b, an amorphous structure is preferably included in the above-mentioned region of the oxide semiconductor layer 112 other than the first region 112a and the second region 112b.

The crystal state of the oxide semiconductor layer 112 can be evaluated by observing a cross section of the oxide semiconductor layer 112 with a transmission electron microscope (TEM). That is, by observing with a TEM the first region 112a and the second region 112b of the oxide semiconductor layer 112 and the region where a channel is to be formed, the degree of crystallization in the first region 112a and the second region 112b and the degree of crystallization in the region where a channel is to be formed may be compared with each other. The crystal state of the oxide semiconductor layer 112 may be evaluated by X-ray diffraction (XRD) measurement.

In FIGS. 1A to 1C, a case where the source electrode layer 106a and the drain electrode layer 106b overlap with edge portions of the gate electrode 102 is described. However, the present invention is not limited to this. For example, one of the source electrode layer 106a and the drain electrode layer 106b may overlap with the gate electrode 102, or none of the source electrode layer 106a nor the drain electrode layer 106b may overlap with the gate electrode 102.

In FIGS. 1A to 1C, the first metal oxide layer 108a and the second metal oxide layer 108b are formed using a material with conductivity (a material with higher conductivity than at least the oxide semiconductor layer 112). For example, the first metal oxide layer 108a and the second metal oxide layer 108b can be formed using a crystalline metal oxide material including at least zinc. As such a metal oxide material, zinc oxide (ZnO), magnesium zinc oxide (ZnMgO), or the like can be used.

The oxide semiconductor layer 112 is formed using a material different from that for the first metal oxide layer 108a and the second metal oxide layer 108b. For example, the oxide semiconductor layer 112 can be formed using an oxide semiconductor including indium, zinc, and gallium, or an oxide semiconductor such as indium zinc oxide (IZO).

As an example, the first metal oxide layer 108a and the second metal oxide layer 108b can be formed using zinc oxide with conductivity, and the oxide semiconductor layer 112 can be formed using an oxide semiconductor layer including indium, zinc, and gallium ($InGaO_3(ZnO)_m$ (m>0)).

In this case, in the oxide semiconductor layer 112, the first region 112a and the second region 112b each including a crystal structure may include more zinc than the other region including an amorphous structure. As an example thereof, a structure in which the first region 112a and the second region 112b with a crystal structure is formed using $InGaZnO_4$ and the other region including an amorphous structure is formed using $InGaZn_{0.5}O_{3.5}$ can be given.

Note that the concentration of zinc in a film of the oxide semiconductor layer can be measured by secondary ion mass spectroscopy (SIMS).

Further, an insulating impurity may be included in the oxide semiconductor layer 112. As the impurity, insulating oxide typified by silicon oxide, germanium oxide, aluminum oxide, or the like, insulating nitride typified by silicon nitride, aluminum nitride, or the like, or insulating oxynitride typified by silicon oxynitride, aluminum oxynitride, or the like is used.

Furthermore, in FIGS. 1A to 1C, in the case where the first metal oxide layer 108a and the second metal oxide layer 108b each including a crystal structure have sufficiently high conductivity, the first metal oxide layer 108a may be provided to serve as a source electrode layer, and the second metal oxide layer 108b may be provided to serve as a drain electrode layer.

As described above, in providing an oxide semiconductor layer as a semiconductor layer forming a channel in a transistor, a region of the oxide semiconductor layer where the channel is to be formed is formed to include an amorphous structure and a portion of the oxide semiconductor layer to be electrically connected to an external portion (the source electrode layer, the drain electrode layer, and the like) is formed to include a crystal structure, whereby characteristic variation among transistors can be reduced and contact resistance can be reduced.

This embodiment can be implemented in combination with any of the other embodiments as appropriate.

Embodiment 2

In this embodiment, an example of a manufacturing method in a case of using a bottom-gate transistor in the structure described in Embodiment 1 (the case illustrated in FIG. 1A) is described with reference to drawings.

Figure 2A:
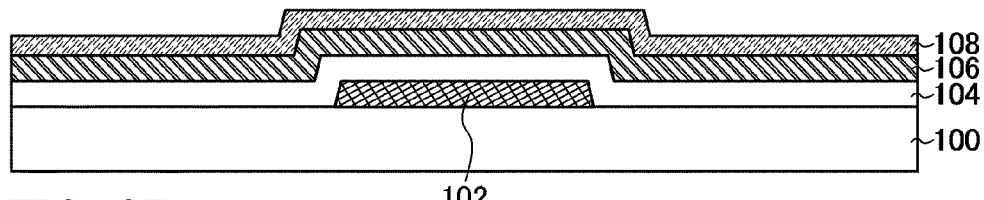
FIGS. 2A to 2E illustrate an example of a method for manufacturing the transistor relating to Embodiment 2.

First, the gate electrode 102 is formed over the substrate 100, and subsequently, the gate insulating layer 104 is formed over the gate electrode 102. Then, the conductive film 106 and the metal oxide layer 108 are sequentially stacked over the gate insulating layer 104 (see FIG. 2A).

As the substrate 100, a substrate having an insulating surface may be used, and for example, a glass substrate can be used. In addition, as the substrate 100, an insulating substrate formed using an insulator such as a ceramic substrate, a quartz substrate, or a sapphire substrate; a semiconductor substrate which is formed using a semiconductor material such as silicon and whose surface is covered with an insulating material; or a conductive substrate which is formed using a conductor such as metal or stainless steel and whose surface is covered with an insulating material can be used. In addition, a plastic substrate can be used as long as it can withstand heat treatment in a manufacturing process.

After the conductive film is formed over an entire surface of the substrate 100, the conductive film is etched by a photolithography method, whereby the gate electrode 102 can be formed. The gate electrode 102 includes an electrode and a wiring which are formed using the conductive film such as a gate wiring.

The gate electrode 102 is preferably formed using a conductive material such as aluminum (Al), copper (Cu), molybdenum (Mo), tungsten (W), or titanium (Ti). Note that in a case where aluminum is used by itself for the wiring or the electrode, there are problems in that aluminum has low heat resistance and that aluminum is easily eroded, for example. Therefore, it is preferable to use aluminum in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc); an alloy including the above element as its component; an alloy film containing a combination of any of the above elements; or nitride including the above element as its component may be used. A film formed using any of these heat-resistant conductive materials and an aluminum (or copper) film may be stacked, so that the wiring and the electrode may be formed.

Note that the gate electrode 102 can be selectively formed over the substrate 100 by a droplet discharge method, a screen printing method, or the like.

The gate insulating layer 104 can be formed using a silicon oxide film, a silicon oxynitride film, a silicon nitride film, a silicon nitride oxide film, an aluminum oxide film, a tantalum oxide film, or the like. In addition, any of these films may be stacked. These films can be formed to be greater than or equal to 50 nm and less than or equal to 250 nm by a sputtering method or the like. For example, as the gate insulating layer 104, a silicon oxide film can be formed to a thickness of 100 nm by a sputtering method.

The conductive film 106 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as its component; or a material including nitride or the like in which the above element is a component.

For example, the conductive film 106 can be formed to have a single-layer structure of a molybdenum film or a titanium film. The conductive film 106 may be formed to have a stacked structure, for example, a stacked structure of an aluminum film and a titanium film. A three-layer structure in which a titanium film, an aluminum film, and a titanium film are sequentially stacked may be used. A three-layer structure in which a molybdenum film, an aluminum film, and a molybdenum film are sequentially stacked may be used. As the aluminum film used for any of these stacked structures, an aluminum film including neodymium (Al—Nd) may be used.

Further alternatively, the conductive film 106 may have a single-layer structure of an aluminum film including silicon.

The metal oxide layer 108 may be formed using a metal oxide material including zinc by a sputtering method, a sol-gel method, or the like. For example, the metal oxide layer 108 can be formed using metal oxide, such as zinc oxide or magnesium oxide, which includes a crystal structure. Note that the metal oxide may be doped with Ga, Al, or the like.

Figure 2B:
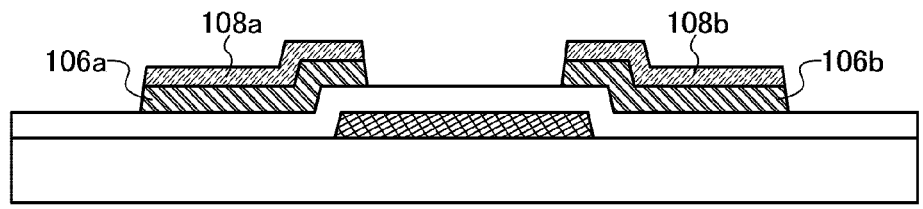

The conductive film 106 and the metal oxide layer 108 are etched to form the source electrode layer 106a, the drain electrode layer 106b, the first metal oxide layer 108a, and the second metal oxide layer 108b and to expose the gate insulating layer 104 over the gate electrode 102 (see FIG. 2B).

Here, a case where the conductive film 106 and the metal oxide layer 108 are etched using the same mask by a photolithography method is described. In this case, the first metal oxide layer 108a is formed over the source electrode layer 106a, and the second metal oxide layer 108b is formed over the drain electrode layer 106b. In addition, here, a case where the source electrode layer 106a and the drain electrode layer 106b overlap with edge portions of the gate electrode 102 is described.

Figure 2C:
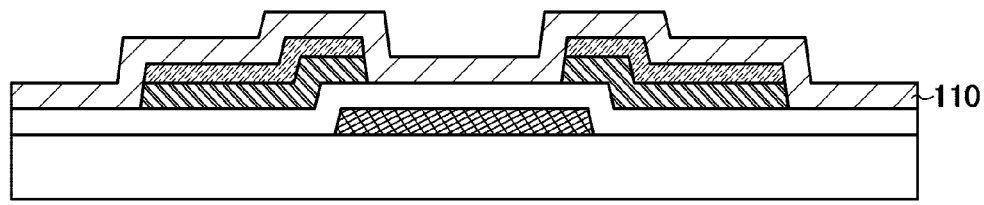

The oxide semiconductor layer 110 is formed over the gate insulating layer 104, the first metal oxide layer 108a, and the second metal oxide layer 108b (see FIG. 2C).

The oxide semiconductor layer 110 can be formed using an oxide semiconductor including at least zinc and an amorphous structure. The oxide semiconductor layer 110 is formed using an oxide semiconductor in which the content of zinc is lower than that in each of the first metal oxide layer 108a and the second metal oxide layer 108b.

For example, the oxide semiconductor layer 110 can be formed using an amorphous oxide semiconductor including indium, zinc, and gallium $(InGaO_3(ZnO)_m \ (m>0))$. In this case, the oxide semiconductor layer 110 including an amorphous structure can be formed by a sputtering method using an oxide semiconductor target including In, Ga, and Zn (for example, $In_2O_3:Ga_2O_3:ZnO=1:1:1$).

The condition of sputtering can be set as follows: the distance between the substrate 100 and the target is 30 mm to 500 mm, the pressure is 0.01 Pa to 2.0 Pa, the direct current (DC) power supply is 0.25 kW to 5.0 kW, the temperature is 20° C. to 100° C., the atmosphere is an argon atmosphere, an oxygen atmosphere, or a mixture atmosphere of argon and oxygen.

Note that when a pulsed direct current (DC) power supply is used in a sputtering method, dust can be reduced and thickness distribution becomes uniform, which is preferable. In addition, the oxide semiconductor layer 110 may have a thickness of approximately 5 nm to 200 nm.

As the above sputtering method, an RF sputtering method using a high frequency power supply, a DC sputtering method using a DC power supply, a pulsed DC sputtering method in which a DC bias is applied in a pulse manner, or the like for a power supply for sputtering can be employed.

An insulating impurity may be included in the oxide semiconductor layer 110. As the impurity, insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride is used. The insulating oxide, the insulating nitride, or the like is added to the oxide semiconductor at a concentration at which electrical conductivity of the oxide semiconductor does not deteriorate. Insulating impurity is contained in the oxide semiconductor, whereby crystallization of a region of the oxide semiconductor layer 110 other than the region in contact with the first metal oxide layer 108a and the second metal oxide layer 108b can be suppressed even when heat treatment or the like is performed. By the suppression of the crystallization of the oxide semiconductor layer 110 to be the channel layer, characteristics of a thin film transistor can be stabilized.

As the oxide semiconductor used for the channel formation region of the thin film transistor, any of the following amorphous oxide semiconductors can be applied in addition to the above: an In—Sn—Zn—O-based amorphous oxide semiconductor; an In—Al—Zn—O-based amorphous oxide semiconductor; a Sn—Ga—Zn—O-based amorphous oxide semiconductor; an Al—Ga—Zn—O-based amorphous oxide semiconductor; a Sn—Al—Zn—O-based amorphous oxide semiconductor; and an In—Zn—O-based amorphous oxide semiconductor. In other words, an impurity which suppresses crystallization to keep an amorphous state is added to these oxide semiconductors, whereby characteristics of the thin film transistor can be stabilized. The impurity is insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride.

Figure 2D:
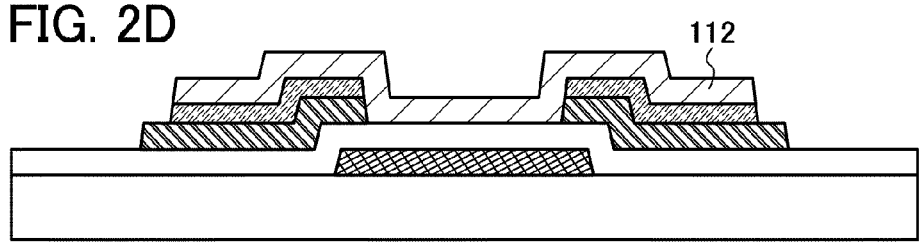

Next, the oxide semiconductor layer 110 is etched to form the island-like oxide semiconductor layer 112 (see FIG. 2D).

By etching of the oxide semiconductor layer 110, the island-like oxide semiconductor layer 112 is left over the gate electrode 102 and between the source electrode layer 106a and the drain electrode layer 106b. In addition, the island-like oxide semiconductor layer 112 is left over the first metal oxide layer 108a and the second metal oxide layer 108b. In this case, under certain etching conditions, the first metal oxide layer 108a and the second metal oxide layer 108b may also be etched (or be reduced in thickness) concurrently with etching of the oxide semiconductor layer 110. Here, a case where the first metal oxide layer 108a and the second metal oxide layer 108b are etched concurrently with etching of the oxide semiconductor layer 110 is described.

Note that even in the case where the first metal oxide layer 108a and the second metal oxide layer 108b are etched concurrently with etching of the oxide semiconductor layer 110, the disconnection or the removal of a wiring which is caused by etching can be inhibited by forming the source electrode layer 106a and the drain electrode layer 106b using the metal material described above.

Figure 2E:
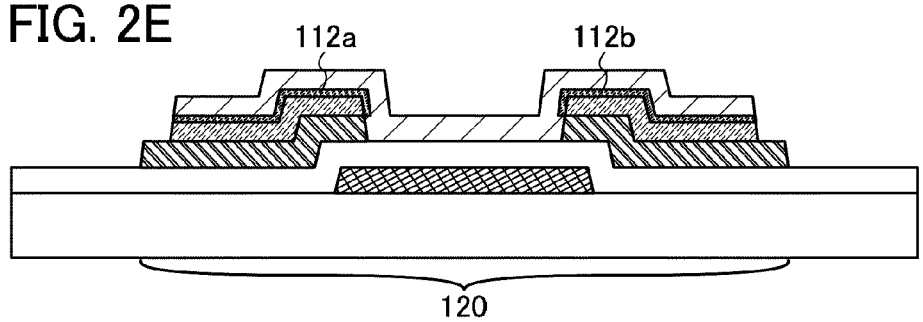

Next, in the oxide semiconductor layer 112, the first region 112a in contact with the first metal oxide layer 108a and the second region 112b in contact with the second metal oxide layer 108b are crystallized by performing heat treatment (see FIG. 2E).

For example, metal oxide including zinc is used for the first metal oxide layer 108a and the second metal oxide layer 108b each including a crystal structure, and an amorphous oxide semiconductor layer including zinc is used for the oxide semiconductor layer 112 including an amorphous structure, so that zinc is moved from the first metal oxide layer 108a and the second metal oxide layer 108b to the oxide semiconductor layer 112, whereby the first region 112a and the second region 112b can be selectively crystallized. This is because the oxide semiconductor layer including a lot of zinc is easily crystallized. That is, the first metal oxide layer 108a and the second metal oxide layer 108b serve as a source of zinc for the oxide semiconductor layer 112.

In this case, in the oxide semiconductor layer 112, the first region 112a in contact with the first metal oxide layer 108a and the second region 112b in contact with the second metal oxide layer 108b can be selectively crystallized, and the other region can be kept amorphous.

More specifically, the first metal oxide layer 108a and the second metal oxide layer 108b can be formed using zinc oxide, and the oxide semiconductor layer 112 can be formed using an oxide semiconductor layer including indium, zinc, and gallium. In this case, by performing heat treatment, zinc in zinc oxide is moved to the oxide semiconductor layer 112 including indium, zinc, and gallium. Thus, selective crystallization can proceed in a region of the oxide semiconductor layer 112 in contact with zinc oxide.

Thus, after the heat treatment, in the oxide semiconductor layer 112, the first region 112a and the second region 112b each including a crystal structure includes more zinc than that included in the other region including an amorphous structure. As an example, in a case where the oxide semiconductor layer 110 is formed using $InGaZn_{0.5}O_{3.5}$, the first region 112a and the second region 112b each including a crystal structure can be $InGaZnO_4$ and the other region including an amorphous structure can be $InGaZn_{0.5}O_{3.5}$ by performing heat treatment. Of course, the compositions of the oxide semiconductor layer 112 described here are just examples, and the compositions are not limited to these. For example, the degree of crystallization in the first region 112a and the second region 112b may be gradient, not uniform, in the oxide semiconductor layer.

In general, it is difficult to crystallize an oxide semiconductor layer including indium, zinc, and gallium and an amorphous structure if heat treatment at 600° C. or more is not performed. However, as illustrated in FIG. 2E, a source of zinc (here, zinc oxide) is provided for the oxide semiconductor layer including indium, zinc, and gallium and including an amorphous structure and heat treatment is performed, whereby the oxide semiconductor layer including indium, zinc, and gallium can be crystallized even when the heat treatment temperature is low. Further, by controlling a portion to be in contact with the source of zinc, a region to be crystallized in the oxide semiconductor layer including indium, zinc, and gallium can be arbitrarily determined.

Note that, in order to move zinc from the first metal oxide layer 108a and the second metal oxide layer 108b to the oxide semiconductor layer 112 more efficiently, it is preferable that the concentration of zinc included in the first metal oxide layer 108a and the second metal oxide layer 108b, which serve as a source of zinc, be made higher than the concentration of zinc included in the oxide semiconductor layer 112.

For the heat treatment in the process illustrated in FIG. 2E, a heating furnace such as a diffusion furnace or a resistance heating furnace, a rapid thermal annealing (RTA) apparatus, or the like can be used.

The heat treatment is preferably performed at 150° C. to 500° C., typically 200° C. to 400° C. For example, heat treatment is performed at 350° C. for 1 hour in an oxygen atmosphere (including an air atmosphere). By this heat treatment, the first region 112a and the second region 112b of the oxide semiconductor layer 112 can be crystallized. Note that the timing of the heat treatment is not particularly limited as long as it is performed after the formation of the oxide semiconductor layer 110. Further, the oxide semiconductor layer 110 may be formed with the substrate 100 heated, whereby the first region 112a and the second region 112b of the oxide semiconductor layer 112 may be crystallized concurrently with the formation of the oxide semiconductor layer 110.

Instead of heating a whole element formed over the substrate 100, irradiation with a laser beam may be performed, so that portions of the source electrode layer 106a and the drain electrode layer 106b are selectively heated.

By the irradiation with a laser beam, the source electrode layer 106a and the drain electrode layer 106b which are formed using a metal material are selectively formed, and thus, the first metal oxide layer 108a provided in contact with the source electrode layer 106a and the second metal oxide layer 108b provided in contact with the drain electrode layer 106b are also heated. Accordingly, zinc is moved from the first metal oxide layer 108a and the second metal oxide layer 108b to the oxide semiconductor layer 112, whereby the first region 112a and the second region 112b can be selectively crystallized.

As for the laser beam to be used, the wavelength or the like thereof may be set as appropriate so that the laser beam is absorbed by at least the source electrode layer 106a and the drain electrode layer 106b. Preferably, the wavelength or the like thereof may be set as appropriate so that the laser beam passes through the first metal oxide layer 108a, the second metal oxide layer 108b, and the oxide semiconductor layer 112, and so that the laser beam is absorbed by the source electrode layer 106a and the drain electrode layer 106b. The laser beam may be emitted from the lower surface side (the rear side of the substrate 100) or may be emitted from the upper surface side (the oxide semiconductor layer 112 side).

As described above, in the oxide semiconductor layer 112, the first region 112a in contact with the first metal oxide layer 108a and the second region 112b in contact with the second metal oxide layer 108b are crystallized, and the region of the oxide semiconductor layer 112 other than the first region 112a and the second region 112b is kept amorphous, whereby characteristic variation among transistors can be reduced and contact resistance between the oxide semiconductor layer 112 and the source electrode layer 106a and the drain electrode layer 106b can be reduced.

Further, before the oxide semiconductor layer 110 is formed, surfaces of the first metal oxide layer 108a and the second metal oxide layer 108b may be subjected to reduction treatment. By subjecting the surfaces of the first metal oxide layer 108a and the second metal oxide layer 108b to the reduction treatment, the concentration of oxygen included in the vicinity of the surfaces of the first metal oxide layer 108a and the second metal oxide layer 108b can be reduced (the concentration of zinc can be increased), so that zinc can be efficiently moved from the first metal oxide layer 108a and the second metal oxide layer 108b to the oxide semiconductor layer 112.

As the reduction treatment, any reduction treatment is acceptable as long as oxygen included in the vicinity of the surfaces of the first metal oxide layer 108a and the second metal oxide layer 108b is reduced. For example, hydrogen plasma treatment, argon plasma treatment, or the like can be used. Specifically, after the first metal oxide layer 108a and the second metal oxide layer 108b are formed (FIG. 2B), the surfaces of the first metal oxide layer 108a and the second metal oxide layer 108b are subjected to hydrogen plasma treatment or argon plasma treatment. Alternatively, after the metal oxide layer 108 is formed (FIG. 2A), a surface of the metal oxide layer 108 may be subjected to reduction treatment.

Through the above-described steps, a transistor 120 in which the oxide semiconductor layer is used as a channel formation region can be formed.

Further, a protective insulating layer may be formed so as to cover the transistor 120. As the protective insulating layer, for example, a single layer or a stacked layer of any of a silicon oxide film, a silicon nitride film, a silicon oxynitride film, a silicon nitride oxide film, an aluminum oxide film, an aluminum nitride film, an aluminum oxynitride film, and an aluminum nitride oxide film may be formed by a CVD method, a sputtering method, or the like. After the protective insulating layer is formed, heat treatment may be performed so that the first region 112a and the second region 112b may be crystallized.

Then, various electrodes and wirings are formed, whereby a semiconductor device which includes the transistor 120 is completed.

Note that in FIGS. 2A to 2E, a case is described where, after the conductive film 106 and the metal oxide layer 108 are sequentially formed, etching is performed to form the source electrode layer 106a, the first metal oxide layer 108a, the drain electrode layer 106b, and the second metal oxide layer 108b. However, the present invention is not limited to this. For example, the metal oxide layer 108 may be formed after the source electrode layer 106a and the drain electrode layer 106b are formed. This case will be described with reference to FIGS. 3A to 3E.

First, the gate electrode 102 is formed over the substrate 100, and subsequently, the gate insulating layer 104 is formed over the gate electrode 102. Then, the source electrode layer 106a and the drain electrode layer 106b are formed over the gate insulating layer 104 (see FIG. 3A).

After a conductive film is formed over the gate insulating layer 104, the conductive film is etched by a photolithography method, whereby the source electrode layer 106a and the drain electrode layer 106b can be formed. Here, a case where the source electrode layer 106a and the drain electrode layer 106b partly overlap with the gate electrode 102 with the gate insulating layer 104 interposed therebetween is described as an example.

Note that the source electrode layer 106a and the drain electrode layer 106b can be selectively formed over the substrate 100 by a droplet discharge method, a screen printing method, or the like.

Figure 3A:
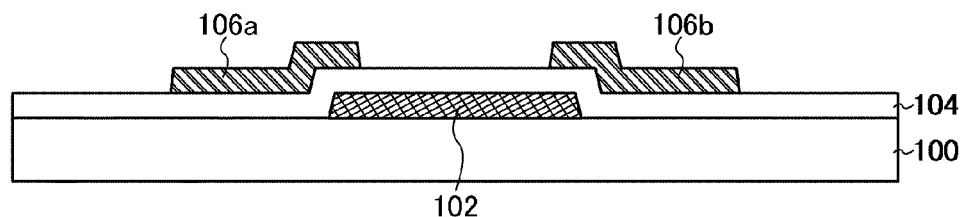
FIGS. 3A to 3E illustrate an example of a method for manufacturing a transistor relating to Embodiment 2.
Figure 3B:
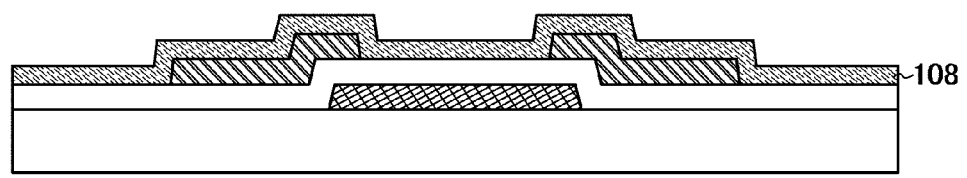

Next, the metal oxide layer 108 including a crystal structure is formed so as to cover the gate insulating layer 104, the source electrode layer 106a, and the drain electrode layer 106b (see FIG. 3B).

Figure 3C:
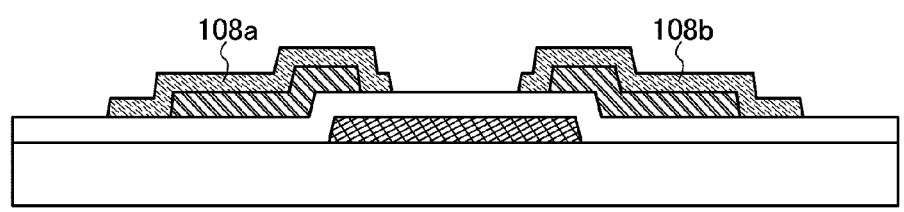

The metal oxide layer 108 is etched to form the first metal oxide layer 108a covering the source electrode layer 106a and to form the second metal oxide layer 108b covering the drain electrode layer 106b (see FIG. 3C).

Figure 3D:
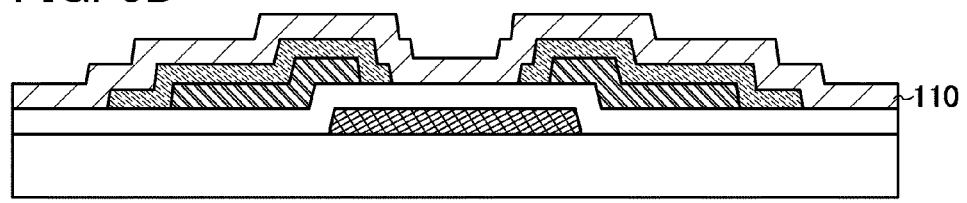

Then, the oxide semiconductor layer 110 is formed so as to be in contact with the gate insulating layer 104, the first metal oxide layer 108a, and the second metal oxide layer 108b (see FIG. 3D).

Figure 3E:
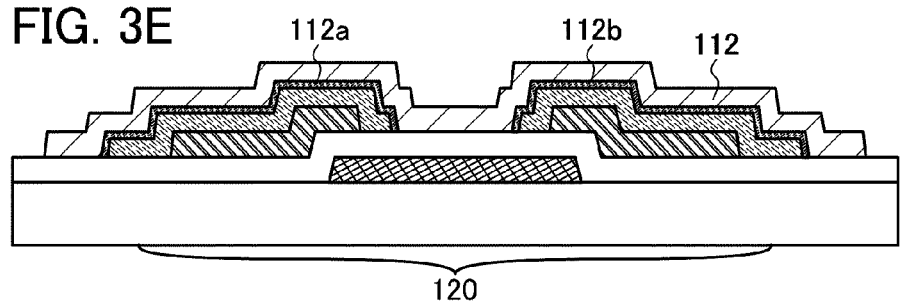

The oxide semiconductor layer 110 is etched to form the island-like oxide semiconductor layer 112, and, in the oxide semiconductor layer 112, the first region 112a in contact with the first metal oxide layer 108a and the second region 112b in contact with the second metal oxide layer 108b are selectively crystallized by heat treatment (see FIG. 3E).

Through the above-described steps, the transistor 120 in which the oxide semiconductor layer 110 is used as a channel formation region can be formed. Note that in the manufacturing process illustrated in FIGS. 3A to 3E, as described above, the surfaces of the first metal oxide layer 108a and the second metal oxide layer 108b may be subjected to reduction treatment before the oxide semiconductor layer 110 is formed. Further, in FIG. 3E, irradiation with a laser beam may be performed instead of performing heat treatment.

As illustrated in FIGS. 3A to 3E, the metal oxide layer 108 is formed after the source electrode layer 106a and the drain electrode layer 106b are formed, whereby the first metal oxide layer 108a and the second metal oxide layer 108b can be formed so as to cover the source electrode layer 106a and the drain electrode layer 106b, respectively. In this case, the area of contact between the oxide semiconductor layer 112 and the first metal oxide layer 108a and the area of contact between the oxide semiconductor layer 112 and the second metal oxide layer 108b can be increased, and contact resistance can be efficiently reduced.

In FIGS. 3A to 3E, a case is described where the first metal oxide layer 108a and the second metal oxide layer 108b are provided in a region above the gate electrode 102 and between the source electrode layer 106a and the drain electrode layer 106b. In this case, a region of the oxide semiconductor layer 112 in contact with the gate insulating layer 104 can be provided with the first region 112a and the second region 112b each including a crystal structure, which is effective in allowing reduction of contact resistance.

Figure 4A:
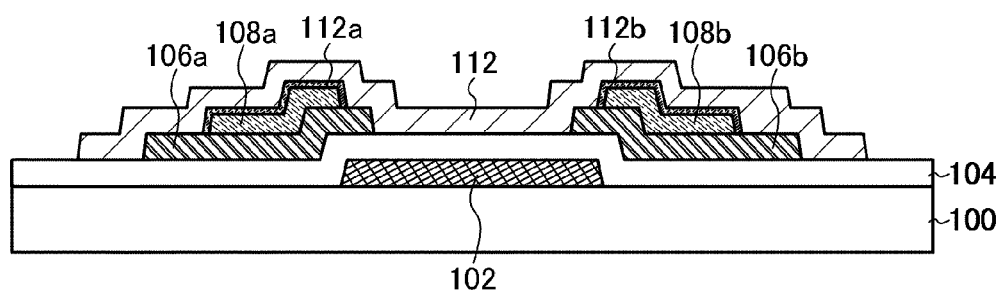
FIGS. 4A and 4B each illustrate an example of a method for manufacturing a transistor relating to Embodiment 2.

Of course, in FIG. 3C, by controlling etching of the metal oxide layer 108, the first metal oxide layer 108a can be formed in part of a region over the source electrode layer 106a, and the second metal oxide layer 108b can be formed in part of a region over the drain electrode layer 106b (see FIG. 4A).

Figure 4B:
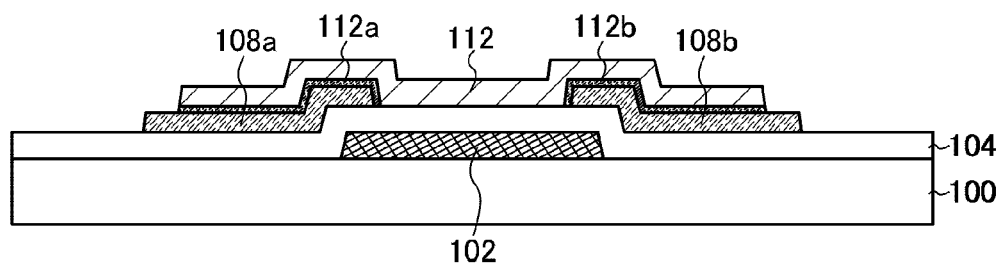

Further, in this embodiment, in a case where the first metal oxide layer 108a and the second metal oxide layer 108b each including a crystal structure have sufficiently high conductivity, the first metal oxide layer 108a may be provided as a source electrode layer and the second metal oxide layer 108b may be provided as a drain electrode layer (see FIG. 4B). In this case, a step of providing the source electrode layer 106a and the drain electrode layer 106b can be omitted.

Note that this embodiment can be implemented in combination with any of the other embodiments as appropriate.

Embodiment 3

In this embodiment, an example of a manufacturing method in a case of using a bottom-gate transistor in the structure described in Embodiment 1 (the case illustrated in FIG. 1B) is described with reference to drawings. Note that the manufacturing process (a material and the like which can be used) described in this embodiment has a lot in common with that described in Embodiment 2. Thus, description of the common portions is omitted, and different portions are described in detail below.

Figure 5A:
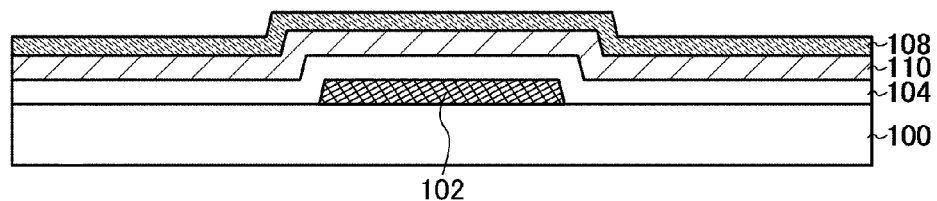
FIGS. 5A to 5E illustrate an example of a method for manufacturing the transistor relating to Embodiment 3.

First, the gate electrode 102 is formed over the substrate 100, and subsequently, the gate insulating layer 104 is formed over the gate electrode 102. Then, the oxide semiconductor layer 110 and the metal oxide layer 108 are sequentially stacked over the gate insulating layer 104 (see FIG. 5A).

The oxide semiconductor layer 110 and the metal oxide layer 108 can be successively formed without exposure to the air. For example, after the oxide semiconductor layer 110 is formed by a sputtering method, a target is changed, so that the metal oxide layer 108 can be formed by a sputtering method. In this case, the adherence of an impurity between the oxide semiconductor layer 110 and the metal oxide layer 108 can be reduced. By the reduction of an impurity between the oxide semiconductor layer 110 and the metal oxide layer 108, the oxide semiconductor layer 112 can be favorably crystallized in a later step.

Figure 5B:
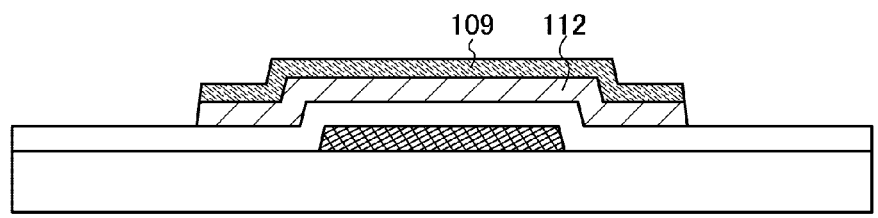

The oxide semiconductor layer 110 and the metal oxide layer 108 are etched to form the island-like oxide semiconductor layer 112 and an island-like metal oxide layer 109 (see FIG. 5B).

Figure 5C:
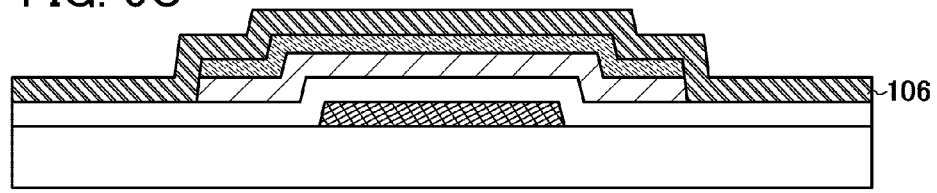

The conductive film 106 is formed over the metal oxide layer 109 (see FIG. 5C).

Figure 5D:
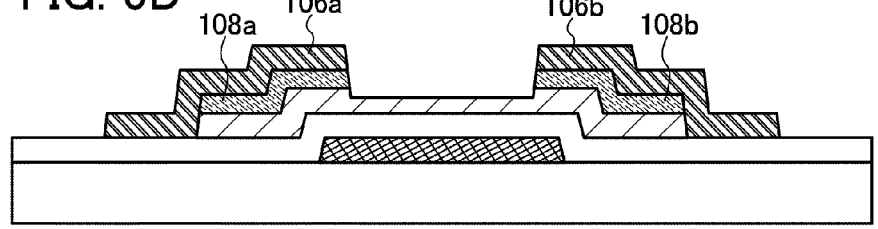

The conductive film 106 and the metal oxide layer 109 are etched to form the source electrode layer 106a, the drain electrode layer 106b, the first metal oxide layer 108a, and the second metal oxide layer 108b and to expose the oxide semiconductor layer 112 (see FIG. 5D).

Thus, the first metal oxide layer 108a and the second metal oxide layer 108b are formed over the oxide semiconductor layer 112, and further, the source electrode layer 106a is formed over the first metal oxide layer 108a and the drain electrode layer 106b is formed over the second metal oxide layer 108b.

Figure 5E:
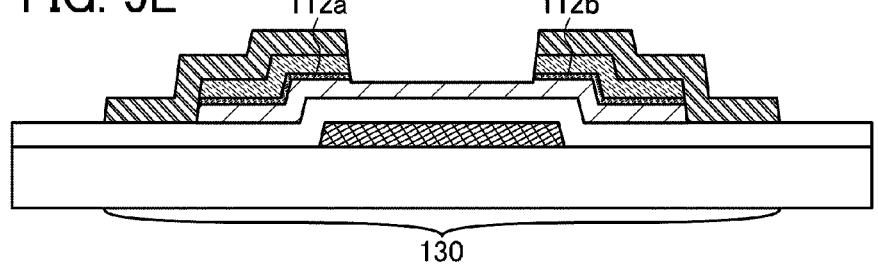

Next, in the oxide semiconductor layer 112, the first region 112a in contact with the first metal oxide layer 108a and the second region 112b in contact with the second metal oxide layer 108b are crystallized by performing heat treatment (see FIG. 5E).

Note that the timing of the above heat treatment is not particularly limited as long as it is performed after the formation of the metal oxide layer 108. Further, the metal oxide layer 108 may be formed with the substrate 100 heated, whereby the surface side of the oxide semiconductor layer 112 may be crystallized concurrently with the formation of the oxide semiconductor layer 108. Instead of performing heat treatment, irradiation with a laser beam may be performed, so that portions of the source electrode layer 106a and the drain electrode layer 106b is selectively heated.

Through the above-described steps, a transistor 130 in which the oxide semiconductor layer is used as a channel formation region can be formed.

As described above, in the oxide semiconductor layer 112, the region 112a in contact with the first metal oxide layer 108a and the region 112b in contact with the second metal oxide layer 108b are crystallized, and the region of the oxide semiconductor layer 112 other than the first region 112a and the second region 112b is kept amorphous, whereby characteristic variation among transistors can be reduced and contact resistance between the oxide semiconductor layer 112 and the source electrode layer 106a and the drain electrode layer 106b can be reduced.

Further, a protective insulating layer may be formed so as to cover the transistor 130. As the protective insulating layer, for example, a single layer or a stacked layer of any of a silicon oxide film, a silicon nitride film, a silicon oxynitride film, a silicon nitride oxide film, an aluminum oxide film, an aluminum nitride film, an aluminum oxynitride film, and an aluminum nitride oxide film may be formed by a CVD method, a sputtering method, or the like. After the protective insulating layer is formed, heat treatment may be performed so that the first region 112a and the second region 112b may be crystallized.

Then, various electrodes and wirings are formed, whereby a semiconductor device which includes the transistor 130 is completed.

Note that, among bottom-gate transistors, a channel-etch transistor in which a recessed portion is formed in the oxide semiconductor layer 112 is described in this embodiment. However, a channel protective transistor may also be used. A case of using a channel protective transistor is described with reference to FIGS. 6A to 6D.

First, the gate electrode 102 is formed over the substrate 100, and subsequently, the gate insulating layer 104 is formed over the gate electrode 102. Then, the oxide semiconductor layer 110 and a protective film 116 are sequentially stacked over the gate insulating layer 104 (see FIG. 6A).

The protective film 116 can be formed using a silicon oxide film, a silicon oxynitride film, a silicon nitride film, a silicon nitride oxide film, an aluminum oxide film, a tantalum oxide film, or the like.

Figure 6A:
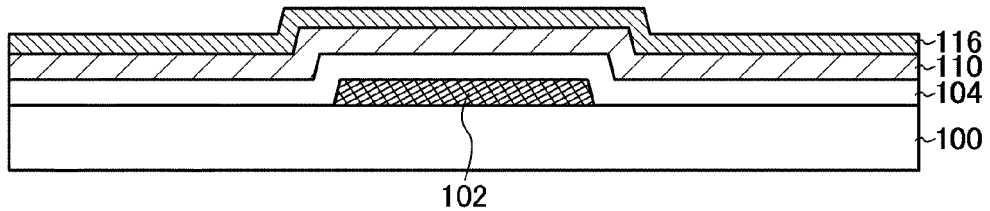
FIGS. 6A to 6D illustrate an example of a method for manufacturing a transistor relating to Embodiment 3.
Figure 6B:
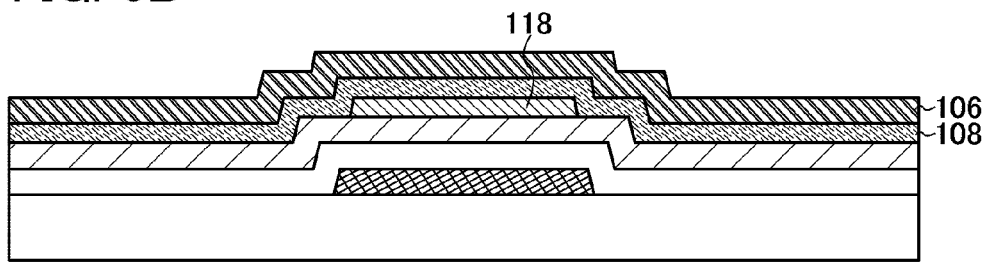

The protective film 116 is etched to form an island-like protective film 118, and then, the metal oxide layer 108 and the conductive film 106 are sequentially stacked so as to cover the oxide semiconductor layer 110 and the protective film 118 (see FIG. 6B).

Figure 6C:
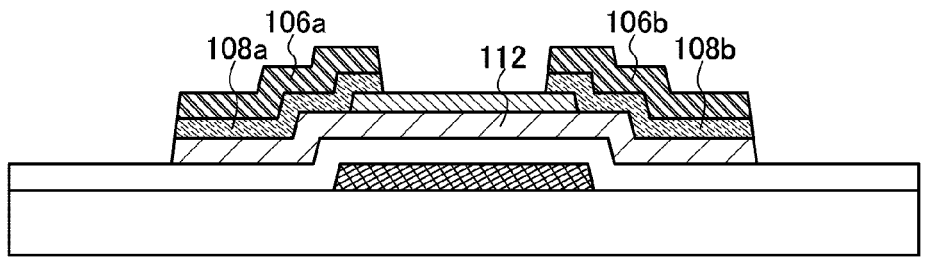

The conductive film 106, the metal oxide layer 108, and the oxide semiconductor layer 110 are etched to form the island-like oxide semiconductor layer 112, the source electrode layer 106a, the drain electrode layer 106b, the first metal oxide layer 108a, and the second metal oxide layer 108b and to expose the protective film 118 (see FIG. 6C).

Figure 6D:
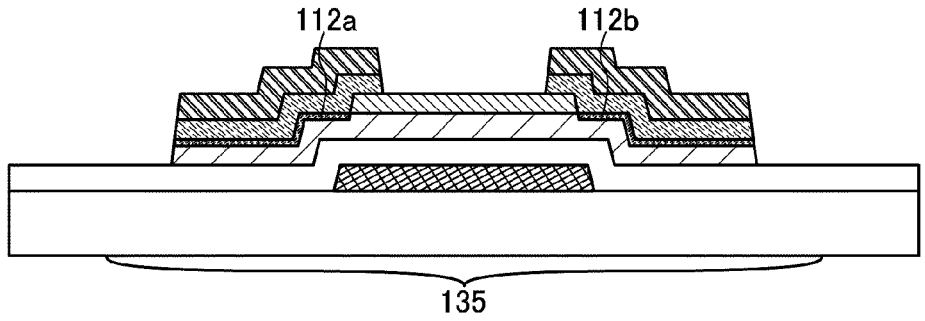

Next, in the oxide semiconductor layer 112, the first region 112a in contact with the first metal oxide layer 108a and the second region 112b in contact with the second metal oxide layer 108b are crystallized by performing heat treatment (see FIG. 6D).

Through the above steps, a channel protective transistor 135 can be formed.

Further, in this embodiment, in the case where the first metal oxide layer 108a and the second metal oxide layer 108b each including a crystal structure have sufficiently high conductivity, the first metal oxide layer 108a may be provided to serve as a source electrode layer, and the second metal oxide layer 108b may be provided to serve as a drain electrode layer. In this case, a step of providing the conductive film 106 (the source electrode layer 106a and the drain electrode layer 106b) can be omitted.

Note that this embodiment can be implemented in combination with any of the other embodiments as appropriate.

Embodiment 4

In this embodiment, an example of a manufacturing method in a case of using a top-gate transistor in the structure described in Embodiment 1 (the case illustrated in FIG. 1C) is described with reference to drawings. Note that the manufacturing process (a material and the like which can be used) described in this embodiment has a lot in common with that described in Embodiment 2. Thus, description of the common portions is omitted, and different portions are described in detail below.

Figure 7A:
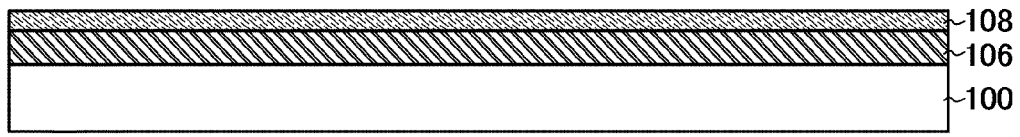
FIGS. 7A to 7E illustrate an example of a method for manufacturing the transistor relating to Embodiment 4.

First, the conductive film 106 and the metal oxide layer 108 are sequentially stacked over the substrate 100 (see FIG. 7A).

Figure 7B:
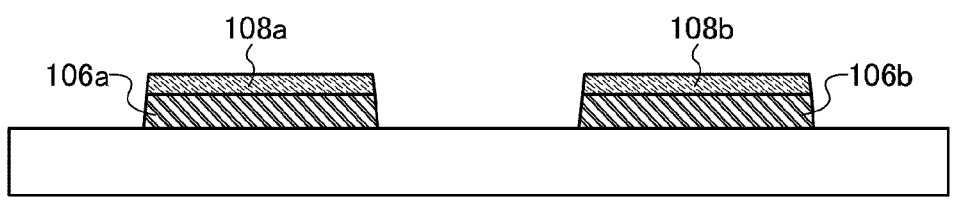

Next, the conductive film 106 and the metal oxide layer 108 are etched to form the source electrode layer 106a, the drain electrode layer 106b, the first metal oxide layer 108a, and the second metal oxide layer 108b (see FIG. 7B).

Here, a case where the conductive film 106 and the metal oxide layer 108 are etched using the same mask by a photolithography method is described. In this case, the first metal oxide layer 108a is formed over the source electrode layer 106a, and the second metal oxide layer 108b is formed over the drain electrode layer 106b.

Figure 7C:
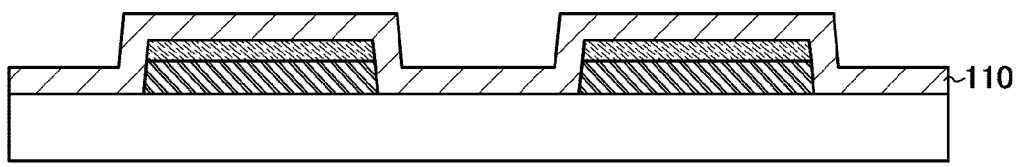

The oxide semiconductor layer 110 is formed over the first metal oxide layer 108a and the second metal oxide layer 108b (see FIG. 7C).

Figure 7D:
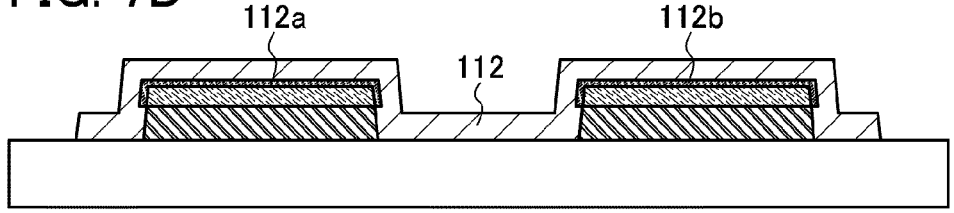

The oxide semiconductor layer 110 is etched to form the island-like oxide semiconductor layer 112, and, in the oxide semiconductor layer 112, the first region 112a in contact with the first metal oxide layer 108a and the second region 112b in contact with the second metal oxide layer 108b are selectively crystallized by heat treatment (see FIG. 7D).

Figure 7E:
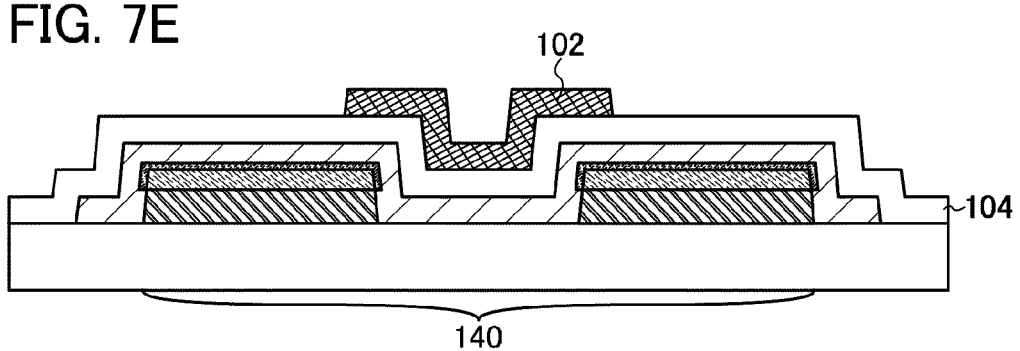

The gate insulating layer 104 is formed over the oxide semiconductor layer 112, and then, the gate electrode 102 is formed over the gate insulating layer 104 (see FIG. 7E).

The gate electrode 102 is formed so as to overlap with at least the oxide semiconductor layer 112 in a region between the source electrode layer 106a and the drain electrode layer 106b. The gate electrode 102 may be formed so as to overlap with the first region 112a and the second region 112b.

In FIGS. 7A to 7E, the timing of the heat treatment is not particularly limited as long as it is performed after the formation of the oxide semiconductor layer 110. Therefore, the heat treatment may be performed after the formation of the gate electrode 102. Further, the oxide semiconductor layer 110 may be formed with the substrate 100 heated, whereby the first region 112a and the second region 112b of the oxide semiconductor layer 112 may be crystallized concurrently with the formation of the oxide semiconductor layer 110.

Through the above-described steps, a transistor 140 in which the oxide semiconductor layer is used as a channel formation region can be formed.

As described above, in the oxide semiconductor layer 112, the region 112a in contact with the first metal oxide layer 108a and the region 112b in contact with the second metal oxide layer 108b are crystallized, and the region of the oxide semiconductor layer 112 other than the first region 112a and the second region 112b is kept amorphous, whereby characteristic variation among transistors can be reduced and contact resistance between the oxide semiconductor layer 112 and the source electrode layer 106a and the drain electrode layer 106b can be reduced.

Further, a protective insulating layer may be formed so as to cover the transistor 140. As the protective insulating layer, for example, a single layer or a stacked layer of any of a silicon oxide film, a silicon nitride film, a silicon oxynitride film, a silicon nitride oxide film, an aluminum oxide film, an aluminum nitride film, an aluminum oxynitride film, and an aluminum nitride oxide film may be formed by a CVD method, a sputtering method, or the like. After the protective insulating layer is formed, heat treatment may be performed so that the first region 112a and the second region 112b may be crystallized.

Then, a variety of electrodes and wirings are formed, whereby a semiconductor device which includes the transistor 140 is completed.

Note that in FIGS. 7A to 7E, a case is described where, after the conductive film 106 and the metal oxide layer 108 are sequentially formed, etching is performed to form the source electrode layer 106a, the first metal oxide layer 108a, the drain electrode layer 106b, and the second metal oxide layer 108b. However, the present invention is not limited to this. For example, the metal oxide layer 108 may be formed after the source electrode layer 106a and the drain electrode layer 106b are formed. This case will be described with reference to FIGS. 8A to 8E.

Figure 8A:
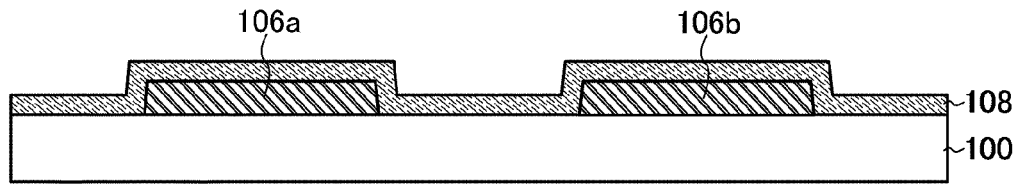
FIGS. 8A to 8E illustrate an example of a method for manufacturing a transistor relating to Embodiment 4.

First, the source electrode layer 106a and the drain electrode layer 106b are formed over the substrate 100, and then, the metal oxide layer 108 is formed so as to cover the source electrode layer 106a and the drain electrode layer 106b (see FIG. 8A).

After a conductive film is formed over the substrate 100, the conductive film is etched by a photolithography method, whereby the source electrode layer 106a and the drain electrode layer 106b can be formed. Note that the source electrode layer 106a and the drain electrode layer 106b can be selectively formed over the substrate 100 by a droplet discharge method, a screen printing method, or the like.

Figure 8B:
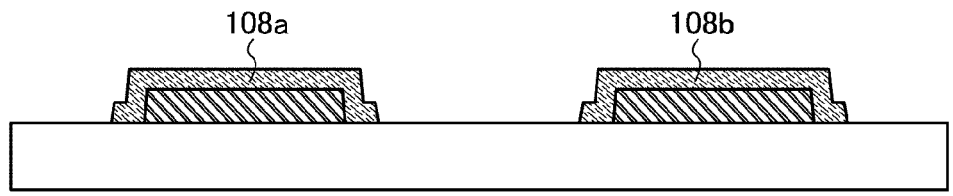

The metal oxide layer 108 is etched to form the first metal oxide layer 108a covering the source electrode layer 106a and to form the second metal oxide layer 108b covering cover the drain electrode layer 106b (see FIG. 8B).

Figure 8C:
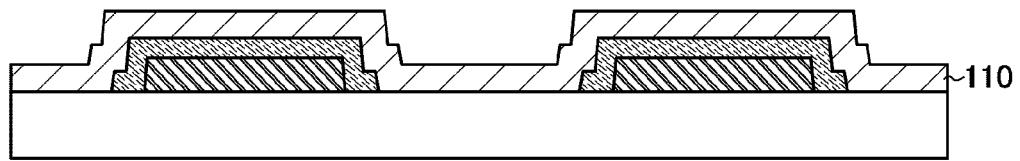

The oxide semiconductor layer 110 is formed so as to cover the first metal oxide layer 108a and the second metal oxide layer 108b (see FIG. 8C).

Figure 8D:
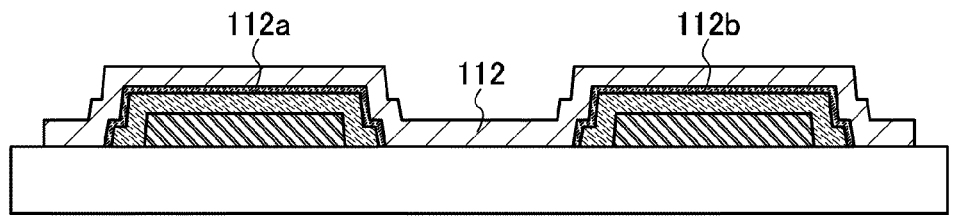

The oxide semiconductor layer 110 is etched to form the island-like oxide semiconductor layer 112, and, in the oxide semiconductor layer 112, the first region 112a in contact with the first metal oxide layer 108a and the second region 112b in contact with the second metal oxide layer 108b are selectively crystallized by heat treatment (see FIG. 8D).

Figure 8E:
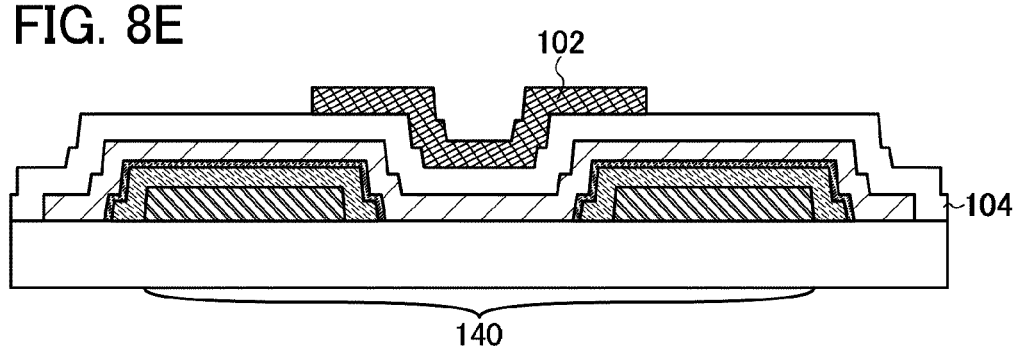

The gate insulating layer 104 is formed over the oxide semiconductor layer 112, and then, the gate electrode 102 is formed over the gate insulating layer 104 (see FIG. 8E).

Through the above-described steps, the transistor 140 in which the oxide semiconductor layer is used as a channel formation region can be formed. Note that in the manufacturing process illustrated in FIGS. 7A to 7E and FIGS. 8A to 8E, the surfaces of the first metal oxide layer 108a and the second metal oxide layer 108b may be subjected to reduction treatment before the oxide semiconductor layer 110 is formed. Further, in FIG. 7D and FIG. 8D, irradiation with a laser beam may be performed instead of performing heat treatment.

As illustrated in FIGS. 8A to 8E, the metal oxide layer 108 is formed after the source electrode layer 106a and the drain electrode layer 106b are formed, whereby the first metal oxide layer 108a and the second metal oxide layer 108b can be provided so as to cover the source electrode layer 106a and the drain electrode layer 106b, respectively. In this case, the area of contact between the oxide semiconductor layer 112 and the first metal oxide layer 108a and the area of contact between the oxide semiconductor layer 112 and the second metal oxide layer 108b can be increased, and contact resistance can be efficiently reduced.

Further, in this embodiment, in the case where the first metal oxide layer 108a and the second metal oxide layer 108b each including a crystal structure have sufficiently high conductivity, the first metal oxide layer 108a may serve as a source electrode layer, and the second metal oxide layer 108b may serve as a drain electrode layer. In this case, a step of providing the conductive film 106 (the source electrode layer 106a and the drain electrode layer 106b) can be omitted.

This embodiment can be implemented in combination with any of the other embodiments as appropriate.

Embodiment 5

In this embodiment, a manufacturing process of a display device which is an example of a usage pattern of a semiconductor device including a transistor described in Embodiments 1 to 4 will be described with reference to drawings. Note that part of the manufacturing process (a material and the like which can be used) described in this embodiment has a lot in common with that in Embodiment 2. Thus, description of the common portions is omitted, and differences are described in detail below. Note that in the following description, FIGS. 9A to 9D and FIGS. 10A to 10D are cross-sectional views of a display device, and FIG. 11, FIG. 12, FIG. 13, and FIG. 14 are top views of the display device. The cross-sectional views shown in FIGS. 9A, 9C, 10B and 10D correspond to cross sections taken along the line A1-A2 and the line B1-B2 which are shown in FIG. 11, FIG. 12, FIG. 13, and FIG. 14.

Figure 11:
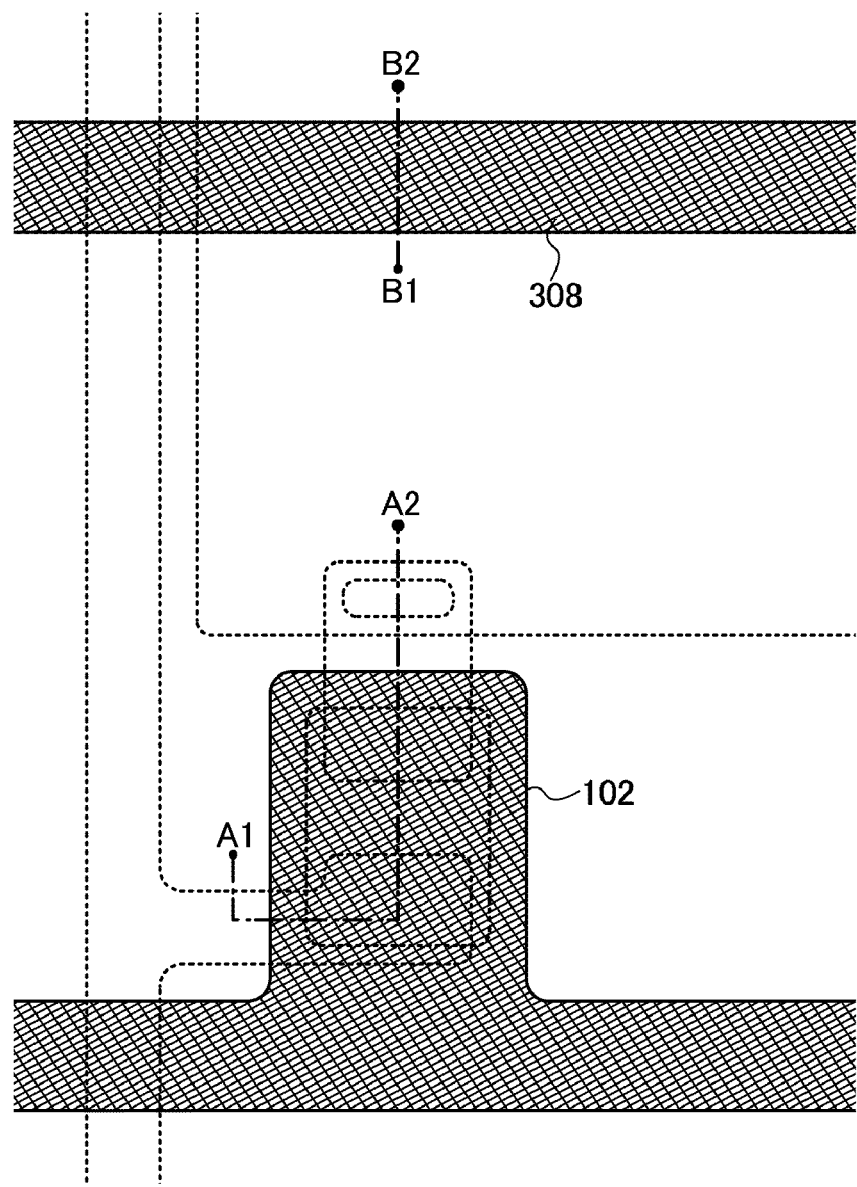
FIG. 11 illustrates the example of the method for manufacturing the semiconductor device relating to Embodiment 5.

First, a wiring and an electrode (a gate wiring including a gate electrode 102, a capacitor wiring 308, and a first terminal 321) are formed over a substrate 100 having an insulating surface (see FIG. 9A and FIG. 11).

The capacitor wiring 308 and the first terminal 321 can be formed using the same material as the gate electrode 102.

Next, the gate insulating layer 104 is formed over the gate electrode 102, and then the conductive film 106 is formed over the gate insulating layer 104 (see FIG. 9B).

In FIG. 9B, after the gate insulating layer 104 is formed, a contact hole 313 is formed in the gate insulating layer 104, and then, the conductive layer 106 is formed. Thus, the first terminal 321 and the conductive film 106 are electrically connected to each other.

Figure 12:
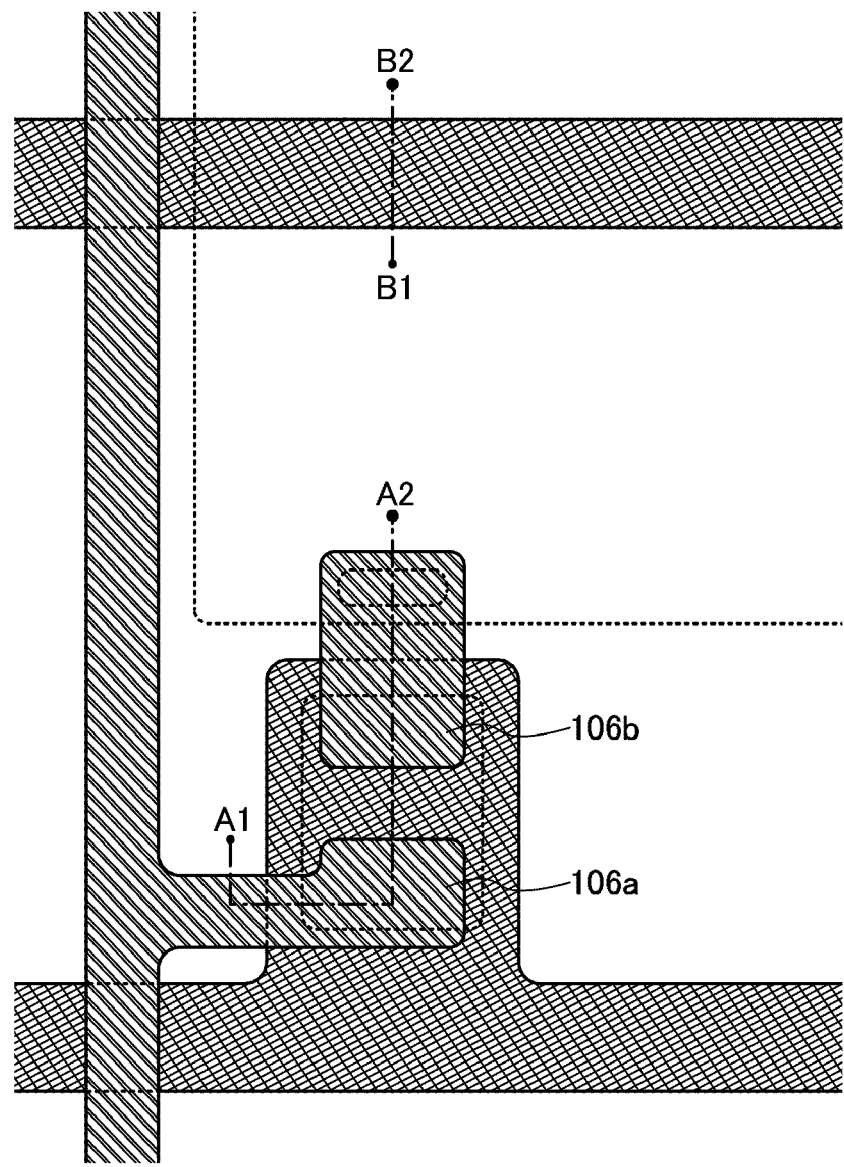
FIG. 12 illustrates the example of the method for manufacturing the semiconductor device relating to Embodiment 5.

Next, the conductive film 106 is etched, whereby the source electrode layer 106a, the drain electrode layer 106b, a connection electrode 320, and a second terminal 322 are formed (see FIG. 9C and FIG. 12).

The second terminal 322 can be electrically connected to a source wiring (a source wiring including the source electrode layer 106a). The connection electrode 320 can be directly connected to the first terminal 321 through the contact hole 313 formed in the gate insulating layer 104.

The metal oxide layer 108 is formed over the source electrode layer 106a and the drain electrode layer 106b (see FIG. 9D).

The metal oxide layer 108 is etched to form the first metal oxide layer 108a over the source electrode layer 106a and the second metal oxide layer 108b over the drain electrode layer 106b, and then, the oxide semiconductor layer 110 is formed over the gate insulating layer 104, the first metal oxide layer 108a, and the second metal oxide layer 108b (see FIG. 10A).

Figure 13:
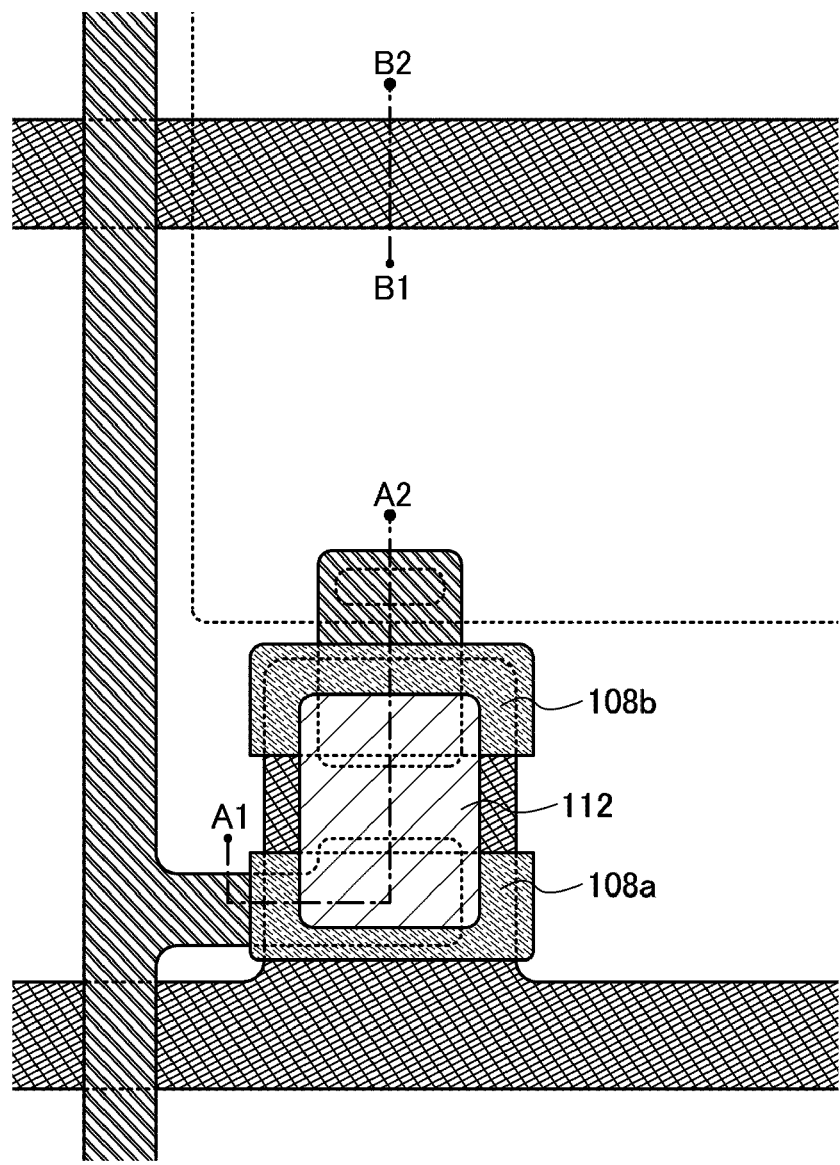
FIG. 13 illustrates the example of the method for manufacturing the semiconductor device relating to Embodiment 5.

The oxide semiconductor layer 110 is etched to form the island-like oxide semiconductor layer 112, and, in the oxide semiconductor layer 112, the first region 112a in contact with the first metal oxide layer 108a and the second region 112b in contact with the second metal oxide layer 108b are selectively crystallized by heat treatment (see FIG. 10B and FIG. 13). Note that here, the surfaces of the first metal oxide layer 108a and the second metal oxide layer 108b are etched partly and their thicknesses are reduced concurrently with etching of the oxide semiconductor layer 110.

Heat treatment is preferably performed at 100° C. to 600° C., typically, 200° C. to 400° C. For example, heat treatment is performed at 350° C. for 1 hour under a nitrogen atmosphere. By this heat treatment, the first region 112a and the second region 112b in the oxide semiconductor layer 112 are crystallized, and in addition, rearrangement at the atomic level of a non-single-crystal film which forms the oxide semiconductor layer 112 is performed. This heat treatment (including light annealing) is effective because distortion which hinders the transfer of carriers is reduced by this heat treatment. Note that the timing of the heat treatment is not particularly limited as long as it is after the formation of the oxide semiconductor layer 110, and for example, heat treatment may be performed after a pixel electrode is formed.

Further, the exposed island-like oxide semiconductor layer 112 may be subjected to oxygen radical treatment. The oxygen radical treatment can repair damage caused by the etching. The radical treatment is preferably performed in an atmosphere of $O_2$ or $N_2O$, and preferably an atmosphere of $N_2$, He, or Ar each containing oxygen. Alternatively, the plasma treatment may be performed in an atmosphere in which $Cl_2$ and $CF_4$ are added to the above atmosphere.

Next, a protective insulating layer 340 is formed so as to cover the thin film transistor formed, and the protective insulating layer 340 is selectively etched, whereby a contact hole 325 which reaches the drain electrode layer 106b, a contact hole 326 which reaches the connection electrode 320, and a contact hole 327 which reaches the second terminal 322 are formed (see FIG. 10C).

Figure 14:
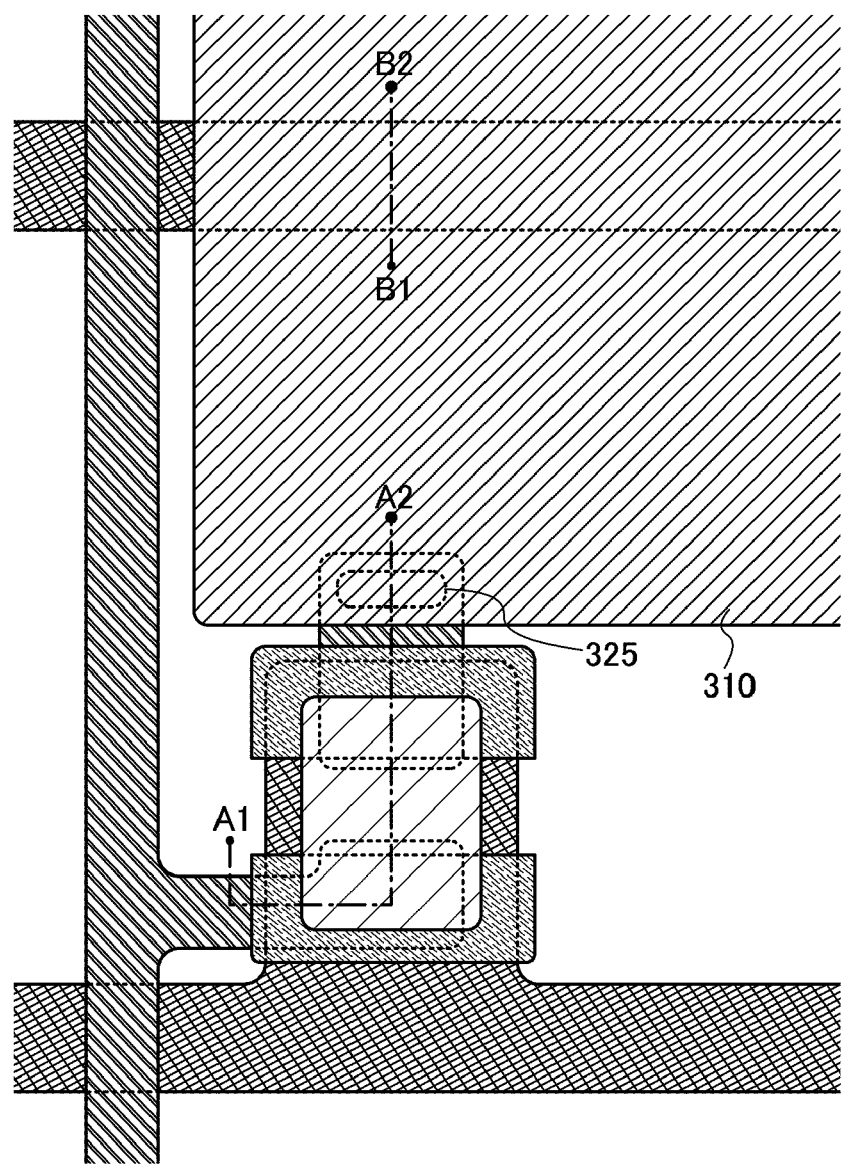
FIG. 14 illustrates the example of the method for manufacturing the semiconductor device relating to Embodiment 5.

Next, a transparent conductive layer 310 which is electrically connected to the drain electrode layer 106b, a transparent conductive layer 328 which is electrically connected to the connection electrode 320, and a transparent conductive layer 329 which is electrically connected to the second terminal 322 are formed (see FIG. 10D and FIG. 14).

The transparent conductive layer 310 functions as a pixel electrode, and the transparent conductive layers 328 and 329 serve as electrodes or wirings used for connection with an FPC. More specifically, the transparent conductive layer 328 formed over the connection electrode 320 can be used as a terminal electrode for connection which functions as an input terminal of a gate wiring, and the transparent conductive layer 329 formed over the second terminal 322 can be used as a terminal electrode for connection which functions as an input terminal of a source wiring.

In addition, a storage capacitor can be formed using the capacitor wiring 308, the gate insulating layer 104, the protective insulating layer 340, and the transparent conductive layer 310. In this case, the capacitor wiring 308 and the transparent conductive layer 310 each serve as an electrode, and the gate insulating layer 104 and the protective insulating layer 340 serve as a dielectric.

The transparent conductive layers 310, 328, and 329 can be formed using indium oxide ($In_2O_3$), an alloy of indium oxide and tin oxide ($In_2O_3$—$SnO_2$, abbreviated to ITO), an alloy of indium oxide and zinc oxide ($In_2O_3$—$ZnO$), or the like by a sputtering method, a vacuum evaporation method, or the like. For example, a transparent conductive film is formed, and then a resist mask is formed over the transparent conductive film. Then, an unnecessary portion is removed by etching, whereby the transparent conductive layers 310, 328, and 329 can be formed.

Through the above-described steps, elements such as a bottom-gate n-channel thin film transistor and the storage capacitor can be completed. Then, these elements are arranged in matrix corresponding to pixels so that the substrate provided with these elements can be used as one substrate for forming an active matrix display device. In this specification, such a substrate is referred to as an active matrix substrate for convenience.

When an active matrix liquid crystal display device is manufactured, a liquid crystal layer may be provided between an active matrix substrate and a counter substrate provided with a counter electrode, and the active matrix substrate and the counter substrate may be fixed.

Figure 15:
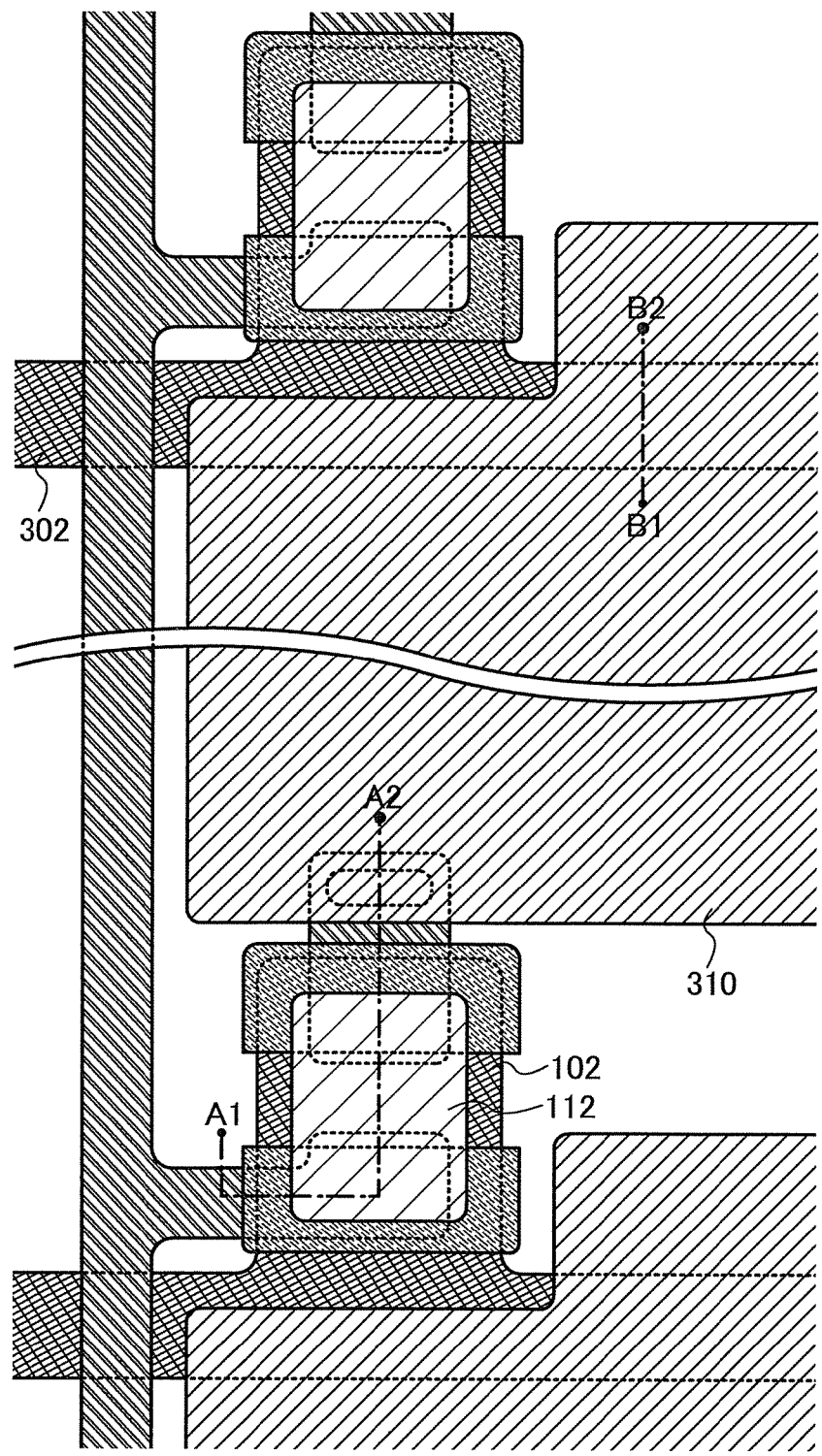
FIG. 15 illustrates an example of a method for manufacturing a semiconductor device relating to Embodiment 5.

The structure described in this embodiment is not limited to the pixel structure illustrated in FIG. 14. An example of another structure is illustrated in FIG. 15. In FIG. 15, the capacitor wiring 308 is not provided, and a storage capacitor is formed using the transparent conductive layer 310 which functions as a pixel electrode and a gate wiring 302 of an adjacent pixel as electrodes and the protective insulating layer 340 and the gate insulating layer 104 as a dielectric.

This embodiment can be implemented in combination with any of the other embodiments as appropriate.

Embodiment 6

In this embodiment, the case where a semiconductor device (also referred to as a display device) having a display function in which thin film transistors manufactured are used for a pixel portion and a driver circuit is manufactured will be described. Furthermore, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying a current to the display element in each of a plurality of pixels. As for the element substrate, specifically, only a pixel electrode of the display element is formed or a conductive film to be a pixel electrode has been deposited and the conductive film is not etched yet to form a pixel electrode. Alternatively, any other mode may be applied to the element substrate.

A display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device is given as an example of a semiconductor device provided with a thin film transistor. First, the appearance and a cross section of a liquid crystal display panel, which is one mode of the semiconductor device, is described with reference to FIGS. 16A1, 16A2, and 16B. FIGS. 16A1 and 16A2 are a top view of panels in which highly reliable thin film transistors 4010 and 4011 each having an oxide semiconductor layer formed over the first substrate 4001 and a liquid crystal element 4013 are sealed between the first substrate 4001 and a second substrate 4006 with a sealant 4005. FIG. 16B is a cross-sectional view taken along line M-N of FIGS. 16A1 and 16A2.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 16A1 illustrates an example of mounting the signal line driver circuit 4003 by a COG method, and FIG. 16A2 illustrates an example of mounting the signal line driver circuit 4003 by a TAB method.

Each of the pixel portion 4002 and the scan line driver circuit 4004 which are provided over the first substrate 4001 includes a plurality of thin film transistors. FIG. 16B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

The structure described in any of the above embodiments can be applied to the thin film transistors 4010 and 4011. In Embodiment 6, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. The pixel electrode layer 4030 and the counter electrode layer 4031 are provided with an insulating layer 4032 and an insulating layer 4033, respectively, each of which functions as an alignment film. Note that the liquid crystal layer 4008 is sandwiched between the pixel electrode layer 4030 and the counter electrode layer 4031 with the insulating layers 4032 and 4033 interposed therebetween.

Note that for each of the first substrate 4001 and the second substrate 4006, glass, metal (typically, stainless steel), ceramic, or plastic can be used. As for plastic, an FRP (fiber-glass-reinforced plastics) plate, a PVF (polyvinyl fluoride) film, a polyester film, or an acrylic resin film can be used. Further, sheet in which aluminum foil is sandwiched by PVF films or polyester films can also be used.

A spacer 4035 is a columnar spacer obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. The counter electrode layer 4031 and the common potential line are electrically connected to each other through conductive particles which are arranged between the pair of substrates using a common connection portion. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a small response time of 10 to 100 μs, has optical isotropy, which makes the alignment process unneeded, and has a small viewing angle dependence.

Note that the liquid crystal display device described in this embodiment is an example of a transmissive liquid crystal display device; however, the liquid crystal display device can be applied to either a reflective liquid crystal display device or a semi-transmissive liquid crystal display device.

The liquid crystal display device described in this embodiment is illustrated in which a polarizing plate is provided on the outer surface of the substrate (on the viewer side) and a color layer and an electrode layer used for a display element are provided on the inner surface of the substrate in that order; however, the polarizing plate may be provided on the inner surface of the substrate. The stacked structure of the polarizing plate and the coloring layer is not limited to that described in Embodiment 6 and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to enhance the reliability of the thin film transistor, the thin film transistor is covered with insulating layers (an insulating layer 4020 and an insulating layer 4021) serving as a protective film or a flattening insulating film. Note that the protective film is provided to prevent entry of impurities floating in air, such as an organic substance, a metal substance, or moisture, and is preferably a dense film. As the protective film, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. Although an example in which the protective film is formed by a sputtering method is described in Embodiment 6, the present invention is not limited to this method and a variety of methods may be employed.

Here, the insulating layer 4020 having a stack structure is formed as the protective film. Here, a silicon oxide film is formed by a sputtering method, as a first layer of the insulating layer 4020. When the silicon oxide film is used as the protective film, the silicon oxide film has an effect of preventing a hillock of an aluminum film used as a source electrode layer and a drain electrode layer.

An insulating layer is formed as a second layer of the protective film. Here, a silicon nitride film is formed by a sputtering method, as a second layer of the insulating layer 4020. The use of the silicon nitride film as the protective film can prevent mobile ions of sodium or the like from entering a semiconductor region so that electrical-characteristic variation among TFTs can be reduced.

After the protective film is formed, the semiconductor layer may be subjected to annealing (300° C. to 400° C.).

The insulating layer 4021 is formed as the planarizing insulating film. The insulating layer 4021 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane resin is a resin formed from a siloxane material as a starting material and having the bond of Si—O—Si. The siloxane-based resin may include an organic group (for example, an alkyl group or an aryl group) or a fluoro group as a substituent. The organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like. In the case where the insulating layer 4021 is formed using a material solution, the semiconductor layer may be annealed (at 300° C. to 400° C.) at the same time of a baking step. The baking step of the insulating layer 4021 also serves as the annealing step of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode formed using a conductive composition preferably has a light transmittance of greater than or equal to 70% at a wavelength of 550 nm. In addition, the resistivity of the conductive high-molecular compound which is included in the conductive composition is desirably less than or equal to 0.1 Ω·cm.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scanning line driver circuit 4004 and the pixel portion 4002 from an FPC 4018.

In Embodiment 6, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 16A1, 16A2, and 16B illustrate an example in which the signal line driver circuit 4003 is formed separately and mounted on the first substrate 4001; however, this embodiment is not limited to this structure. The scanning line driver circuit may be formed separately and then mounted, or only a part of the signal line driver circuit or a part of the scanning line driver circuit may be formed separately and then mounted.

This embodiment can be combined with the structure disclosed in other embodiments, as appropriate.

Embodiment 7

In this embodiment, electronic paper is given as an example of a semiconductor device provided with a transistor.

Figure 17:
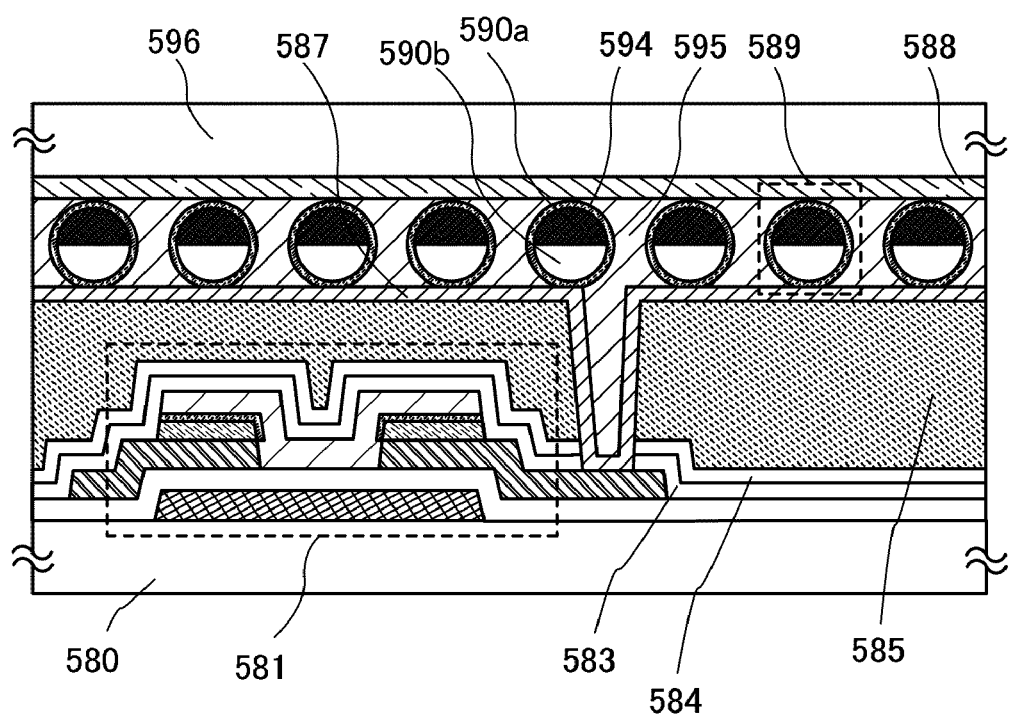
FIG. 17 illustrates an example of a semiconductor device relating to Embodiment 7.

FIG. 17 illustrates active matrix electronic paper as an example of the semiconductor device. A thin film transistor 581 used for the semiconductor device can be manufactured in a manner similar to the thin film transistors described in any of Embodiments 1 to 5.

The electronic paper in FIG. 17 is an example of a display device using a twisting ball display system. The twisting ball display system refers to a method in which spherical particles each colored in black and white are arranged between a first electrode layer and a second electrode layer which are used for a display element, and a potential difference is generated between the first electrode layer and the second electrode layer to control orientation of the spherical particles, so that display is performed.

The thin film transistor 581 provided over a substrate 580 is a thin film transistor having a bottom gate structure. A source electrode layer or a drain electrode layer is electrically connected to a first electrode layer 587 through a contact hole formed in insulating layers 583, 584, and 585. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (FIG. 17). In FIG. 17, the first electrode layer 587 corresponds to a pixel electrode, and the second electrode layer 588 corresponds to a common electrode. The second electrode layer 588 is electrically connected to a common potential line provided over the same substrate as the thin film transistor 581. A common connection portion described in the above embodiment is used, whereby the second electrode layer 588 provided on a substrate 596 and the common potential line can be electrically connected to each other through the conductive particles arranged between a pair of substrates.

Instead of the twisting ball, an electrophoretic element can also be used. In that case, a microcapsule having a diameter of approximately 10 μm to 200 μm, in which transparent liquid, positively charged white microparticles, and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is referred to as an electronic paper in general. The electrophoretic display element has higher reflectivity than a liquid crystal display element; thus, an auxiliary light is unnecessary, less power is consumed, and a display portion can be recognized even in a dusky place. In addition, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

In this manner, highly reliable electronic paper can be formed as a semiconductor device.

This embodiment can be combined with the structure disclosed in other embodiment, as appropriate.

Embodiment 8

In this embodiment, an example of a light-emitting display device will be described as a semiconductor device provided with a transistor. As a display element included in a display device, a light-emitting element utilizing electro luminescence is described here. Light emitting elements utilizing electroluminescence are classified according to the type of a light emitting material, that is, an organic compound or an inorganic compound. In general, the former is referred to as an organic EL element, the latter as an inorganic EL element.

In an organic EL element, voltage is applied to the light-emitting element, so that electrons are injected from an electrode into a layer including a light-emitting organic compound, and holes are injected from the other electrode into the layer including the light-emitting organic compound, and electric current flows. Then, by recombination of these carriers (electrons and holes), the organic compound having a light-emitting property gets in an excited state, and light is emitted when the excited state returns to a ground state. From such a mechanism, such a light emitting element is referred to as a current excitation type light emitting element.

Inorganic EL elements are classified in a dispersive inorganic EL element and a thin-film inorganic EL element. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes, and the light-emitting mechanism is a localization type light-emitting utilizing core electronic transition.

Figure 18A:
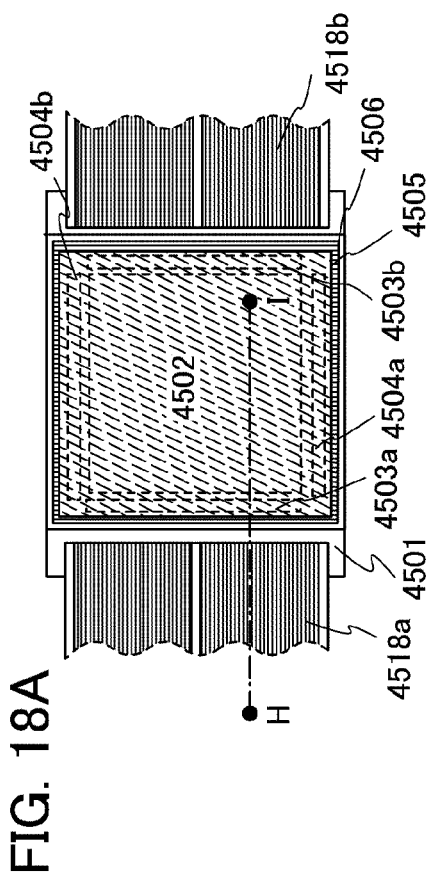
FIGS. 18A and 18B illustrate an example of a semiconductor device relating to Embodiment 8.
Figure 18B:
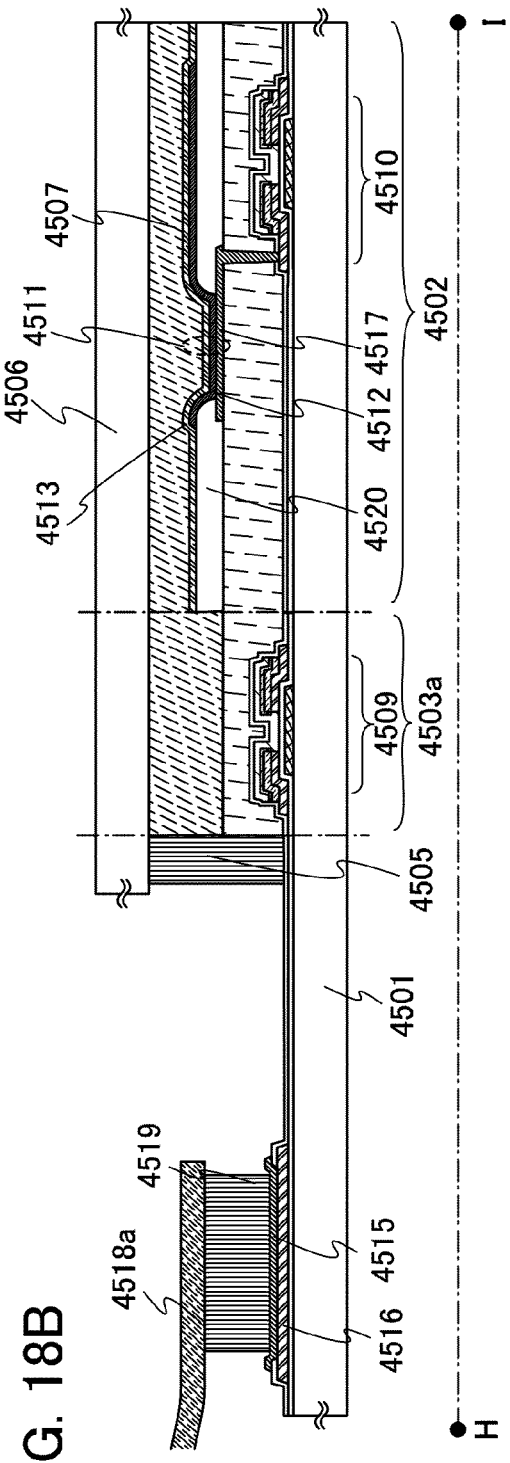

Next, the appearance and a cross section of a light-emitting display panel (also referred to as a light-emitting panel), which is an embodiment of the semiconductor device of the present invention, will be described with reference to FIGS. 18A and 18B. FIG. 18A is a top view of a panel in which a thin film transistor 4509, a thin film transistor 4510, and a light-emitting element 4511 which are formed over a first substrate 4501 are sealed between the first substrate 4501 and a second substrate 4506 with a sealant 4505. FIG. 18B corresponds to a cross-sectional view taken along the line H-I in FIG. 18A. Note that description is made here using an organic EL element as a light-emitting element.

A sealant 4505 is provided to surround a pixel portion 4502, signal line driver circuits 4503*a* and 4503*b*, and scanning line driver circuits 4504*a* and 4504*b*, which are provided over a first substrate 4501. In addition, a second substrate 4506 is provided over the pixel portion 4502, the signal line driver circuits 4503*a* and 4503*b*, and the scanning line driver circuits 4504*a* and 4504*b*. Accordingly, the pixel portion 4502, the signal line driver circuits 4503*a* and 4503*b*, and the scanning line driver circuits 4504*a* and 4504*b* are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503*a* and 4503*b*, and the scanning line driver circuits 4504*a* and 4504*b* formed over the first substrate 4501 each include a plurality of thin film transistors, and the thin film transistor 4510 included in the pixel portion 4502 and the thin film transistor 4509 included in the signal line driver circuit 4503*a* are illustrated as an example in FIG. 18B.

The structure described in any of the above embodiments can be applied to the thin film transistors 4509 and 4510. In Embodiment 8, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stack structure described in Embodiment 8, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering into the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scanning line driver circuits 4504*a* and 4504*b*, and the pixel portion 4502 from FPCs 4518*a* and 4518*b*.

In Embodiment 8, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal of the FPC 4518*a* through an anisotropic conductive film 4519.

The second substrate 4506 located in the direction in which light is extracted from the light-emitting element 4511 needs to have a light-transmitting property. In that case, a material with a light-transmitting property, such as a glass plate, a plastic sheet, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment may be carried out by which reflected light can be diffused by projections and depressions on the surface so as to reduce the glare.

The signal line driver circuits 4503*a* and 4503*b* and the scanning line driver circuits 4504*a* and 4504*b* may be mounted as driver circuits formed using a single crystal semiconductor film or a polycrystalline semiconductor film over a substrate separately prepared. In addition, only the signal line driver circuit or part thereof, or the scanning line driver circuit or part thereof may be separately formed to be mounted. This embodiment is not limited to the structure shown in FIGS. 18A and 18B.

Through the above process, a highly reliable light-emitting display device (display panel) as a semiconductor device can be manufactured.

This embodiment can be combined with the structure disclosed in other embodiments, as appropriate.

Embodiment 9

A semiconductor device provided with the thin film transistor according to any of the above embodiments can be applied to a variety of electronic appliances (including an amusement machine). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 19A:
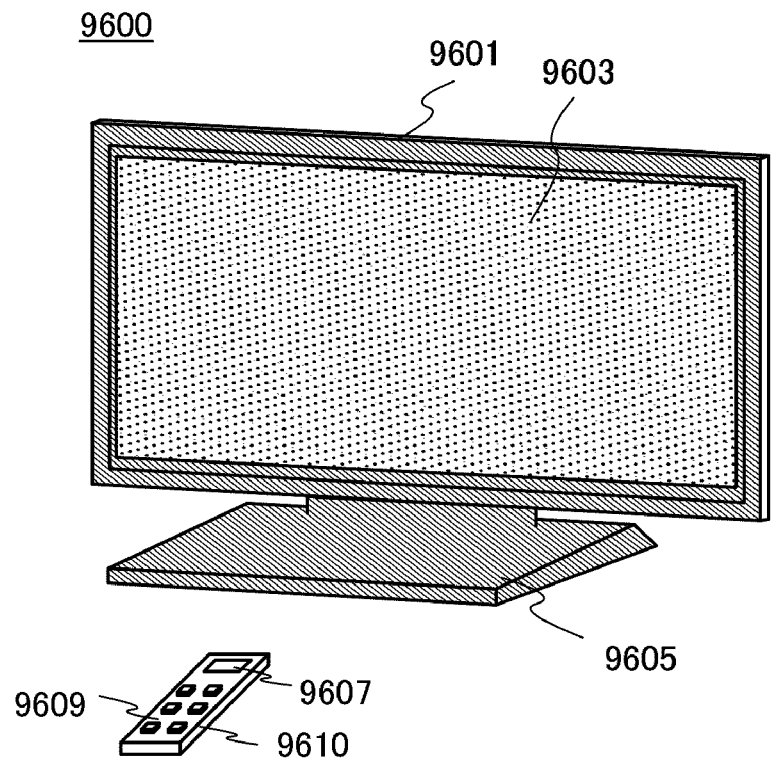
FIGS. 19A and 19B are external views illustrating examples of a television device and a digital photo frame, respectively.

FIG. 19A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 19B:
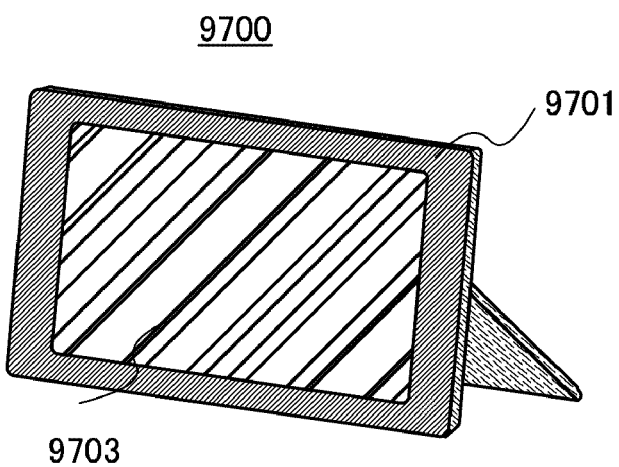

FIG. 19B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot taken by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot taken by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 20A:
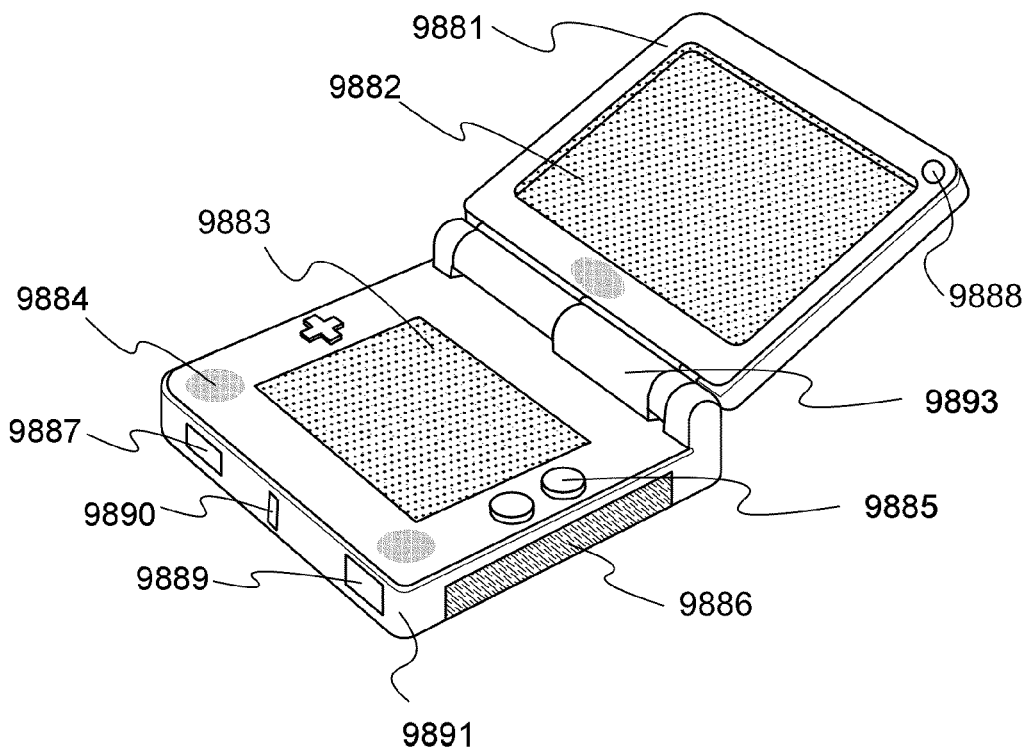
FIGS. 20A and 20B are external views illustrating examples of game machines.

FIG. 20A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. The portable game machine illustrated in FIG. 20A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889, and the like). Needless to say, the structure of the portable game machine is not limited to the above, and may be any structure as long as a semiconductor device according to one embodiment of the present invention is provided. Moreover, another accessory may be provided as appropriate. The portable game machine illustrated in FIG. 20A has a function of reading out a program or data stored in a storage medium to display it on the display portion, and a function of sharing information with another portable game machine by wireless communication. The portable game machine in FIG. 20A can have a variety of functions other than those above.

Figure 20B:
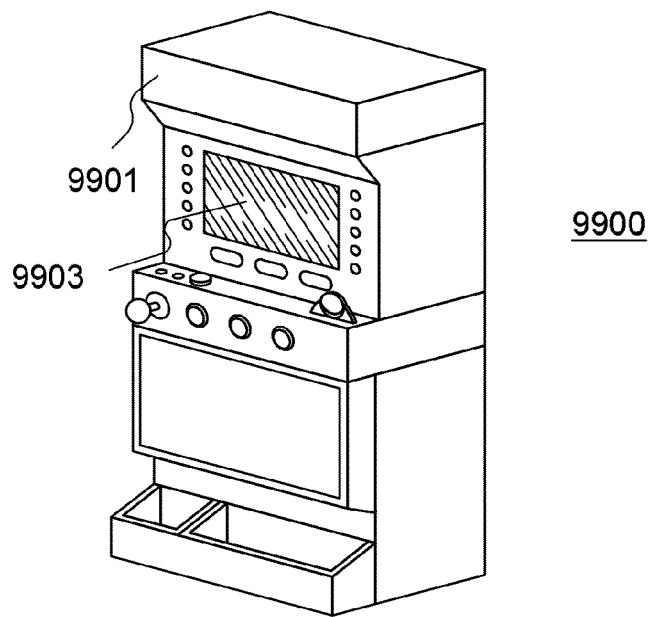

FIG. 20B illustrates an example of a slot machine 9900, which is a large game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

EXAMPLE 1

Figure 21:
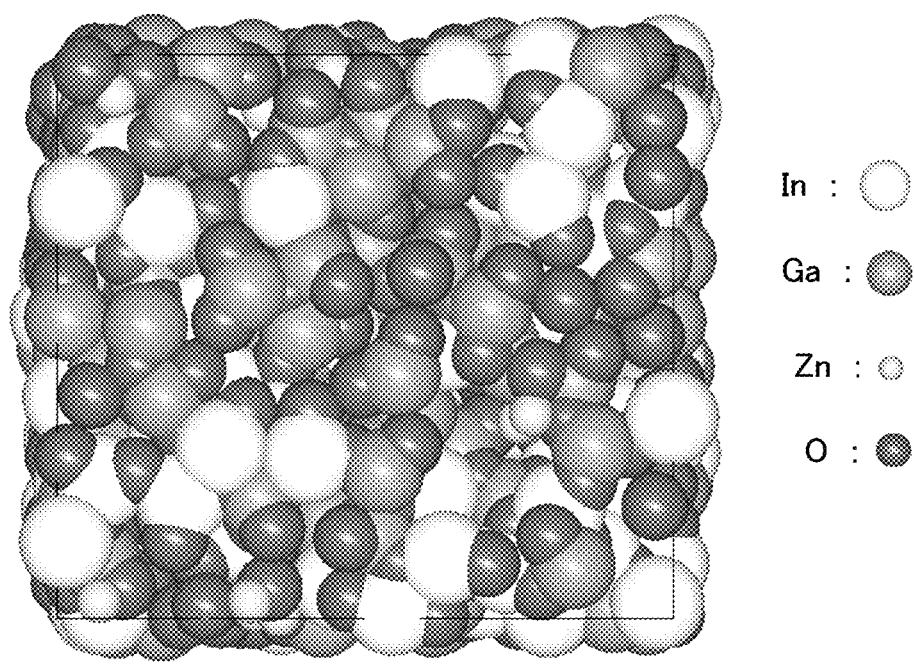
FIG. 21 illustrates a model used for simulation.

In this example, a result of studying diffusion of zinc in an oxide semiconductor including In (indium), Ga (gallium), and Zn (zinc), which is so-called IGZO, by classical molecular dynamics simulation is described.
<Calculation Method>
First, by a classical molecular dynamics simulation under the condition where the temperature T was set at 500° C., an equation of motion of each atom was numerically solved, whereby motion of each atom was tracked. In accordance with the mean-square displacement of each atom (In, Ga, Zn, O) which was obtained from the calculation results, the diffusion coefficient D of each atom was calculated by Einstein's formula (formula (1)). In specific, a slope of a graph in a long-time region where the mean-square displacement of each atom is linearized with respect to time was examined, whereby a diffusion coefficient D was obtained. As the diffusion coefficient D is higher, diffusion is more likely to occur.

$$\lim_{t\to\infty}\left\langle\frac{1}{N}\sum_{i=1}^{N}|r_i(t)-r_i(0)|^2\right\rangle_t = 6Dt \quad \text{(formula (1))}$$

$$\left\langle\frac{1}{N}\sum_{i=1}^{N}|r_i(t)-r_i(0)|^2\right\rangle_t :$$

mean-square displacement of each atom
  N: number of each atom
  $r_i(t)$: position of i-th atom at the time of t
  $\langle\ \rangle_t$: average at the time of t
<Calculation Model and Calculation Conditions>
As a calculation model, a-IGZO with 1320 atoms (In: 220 atoms, Ga: 220 atoms, Zn: 110 atoms, O: 770 atoms) at a density of 5.9 g/cm$^3$ was prepared (see FIG. 21). Here, three-dimensional periodic boundary conditions were used, whereby the a-IGZO model was used as a model for calculating bulk.

In the classical molecular dynamics simulation used in this calculation, an empirical potential which characterizes the interaction between atoms is defined, whereby force acting on each atom is evaluated. For the interaction between oxygen and oxygen and the interaction between metal and oxygen, a Born-Mayer-Huggins potential was used.

Classical molecular dynamics simulation was performed on the calculation model under the conditions where the temperature T was set at 500° C. and the time was set to 4 nanoseconds (time step: 0.2 femtoseconds×20 million steps).

Figures 22A, 22B:
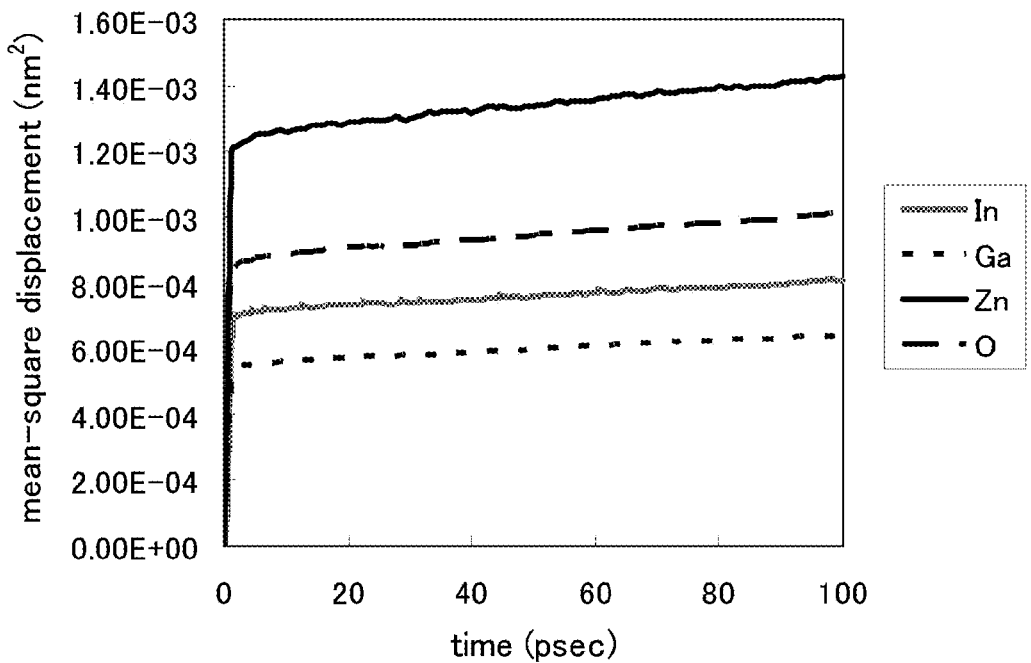
FIGS. 22A and 22B illustrate diffusion coefficients of elements calculated by simulation.

<Calculation Result and Consideration>
FIG. 22A shows mean-square displacements of elements in the a-IGZO which were obtained from the calculation. FIG. 22B illustrates the diffusion coefficients D of the elements which were obtained from regions in FIG. 22A where the slopes of a graph were substantially constant (50 picoseconds to 100 picoseconds). As shown in FIG. 22B, the diffusion coefficient of Zn is the highest of the elements. From this result, by providing zinc oxide, which is to be a source of zinc, for an oxide semiconductor layer including In, Ga, and Zn in the structures described in Embodiments, zinc in the zinc oxide is likely to efficiently diffuse into the oxide semiconductor layer.

This application is based on Japanese Patent Application serial no. 2009-024966 filed with Japan Patent Office on Feb. 5, 2009, the entire contents of which are hereby incorporated by reference.

What is claimed is:
1. A method for manufacturing a transistor comprising the steps of:
  forming a gate electrode over a substrate;
  forming a gate insulating layer over the gate electrode;
  forming a source electrode layer and a drain electrode layer over the gate insulating layer;
  forming a first metal oxide layer including zinc and a crystal structure over the source electrode layer;
  forming a second metal oxide layer including zinc and a crystal structure over the drain electrode layer;
  forming an oxide semiconductor layer including zinc and an amorphous structure over the gate electrode and on the first metal oxide layer and the second metal oxide layer; and
  performing heat treatment to move zinc from the first metal oxide layer and the second metal oxide layer to the oxide semiconductor layer such that a first region in contact with the first metal oxide layer and a second region in contact with the second metal oxide layer are crystallized in the oxide semiconductor layer.

2. The method for manufacturing the transistor according to claim 1,
  wherein the oxide semiconductor layer is formed using a composition different from a composition of the first metal oxide layer and the second metal oxide layer.

3. The method for manufacturing the transistor according to claim 1,
  wherein the first metal oxide layer and the second metal oxide layer are formed using zinc oxide, and
  wherein the oxide semiconductor layer is formed using an oxide semiconductor layer including indium, zinc, and gallium.

4. The method for manufacturing the transistor according to claim 1,
  wherein the oxide semiconductor layer is formed by a sputtering method using a target including indium, gallium, and zinc.

5. The method for manufacturing the transistor according to claim 1,
  wherein a portion of the oxide semiconductor layer located between the source electrode layer and the drain electrode layer is kept amorphous in the performing heat treatment step.

6. The method for manufacturing the transistor according to claim 1,
  wherein a portion of the oxide semiconductor layer located to overlap with the gate electrode is kept amorphous in the performing heat treatment step.

7. A method for manufacturing a transistor comprising the steps of:
  forming a gate electrode over a substrate;
  forming a gate insulating layer over the gate electrode;
  forming an oxide semiconductor layer including zinc and an amorphous structure over the gate insulating layer;
  forming a first metal oxide layer and a second metal oxide layer each including zinc and a crystal structure over the oxide semiconductor layer;
  forming a source electrode layer over the first metal oxide layer;
  forming a drain electrode layer over the second metal oxide layer; and
  performing heat treatment to move zinc from the first metal oxide layer and the second metal oxide layer to the oxide semiconductor layer such that a first region in contact with the first metal oxide layer and a second region in contact with the second metal oxide layer are crystallized in the oxide semiconductor layer.

8. The method for manufacturing the transistor according to claim 7,
  wherein the oxide semiconductor layer is formed using a composition different from a composition of the first metal oxide layer and the second metal oxide layer.

9. The method for manufacturing the transistor according to claim 7,
  wherein the first metal oxide layer and the second metal oxide layer are formed using zinc oxide, and
  wherein the oxide semiconductor layer is formed using an oxide semiconductor layer including indium, zinc, and gallium.

10. The method for manufacturing the transistor according to claim 7,
  wherein the oxide semiconductor layer is formed by a sputtering method using a target including indium, gallium, and zinc.

11. The method for manufacturing the transistor according to claim 7,
  wherein a portion of the oxide semiconductor layer located between the source electrode layer and the drain electrode layer is kept amorphous in the performing heat treatment step.

12. The method for manufacturing the transistor according to claim 7,
  wherein a portion of the oxide semiconductor layer located to overlap with the gate electrode is kept amorphous in the performing heat treatment step.

13. A method for manufacturing a transistor comprising the steps of:
  forming a source electrode layer and a drain electrode layer over a substrate;
  forming a first metal oxide layer including zinc and a crystal structure over the source electrode layer;
  forming a second metal oxide layer including zinc and a crystal structure over the drain electrode layer;
  forming an oxide semiconductor layer including zinc and an amorphous structure on the first metal oxide layer and the second metal oxide layer;
  performing heat treatment to move zinc from the first metal oxide layer and the second metal oxide layer to the oxide semiconductor layer such that a first region in contact with the first metal oxide layer and a second region in contact with the second metal oxide layer are crystallized in the oxide semiconductor layer;
  forming a gate insulating layer over the oxide semiconductor layer; and
  forming a gate electrode over the gate insulating layer overlapping the oxide semiconductor layer.

14. The method for manufacturing the transistor according to claim 13,
  wherein the oxide semiconductor layer is formed using a composition different from a composition of the first metal oxide layer and the second metal oxide layer.

15. The method for manufacturing the transistor according to claim 13,
  wherein the first metal oxide layer and the second metal oxide layer are formed using zinc oxide, and
  wherein the oxide semiconductor layer is formed using an oxide semiconductor layer including indium, zinc, and gallium.

16. The method for manufacturing the transistor according to claim 13,
  wherein the oxide semiconductor layer is formed by a sputtering method using a target including indium, gallium, and zinc.

17. The method for manufacturing the transistor according to claim 13,
  wherein a portion of the oxide semiconductor layer located between the source electrode layer and the drain electrode layer is kept amorphous in the performing heat treatment step.

18. The method for manufacturing the transistor according to claim 13,
  wherein a portion of the oxide semiconductor layer located to overlap with the gate electrode is kept amorphous in the performing heat treatment step.

* * * * *